(12) United States Patent
Kurosawa

(10) Patent No.: US 12,154,619 B2
(45) Date of Patent: Nov. 26, 2024

(54) NONVOLATILE MEMORY

(71) Applicant: Kioxia Corporation, Tokyo (JP)

(72) Inventor: Yasuhiko Kurosawa, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 161 days.

(21) Appl. No.: 17/929,439

(22) Filed: Sep. 2, 2022

(65) Prior Publication Data

US 2023/0317152 A1  Oct. 5, 2023

(30) Foreign Application Priority Data

Mar. 17, 2022 (JP) ................................ 2022-042300

(51) Int. Cl.
*G11C 11/56* (2006.01)
*G11C 16/10* (2006.01)

(52) U.S. Cl.
CPC ...... *G11C 11/5628* (2013.01); *G11C 11/5671* (2013.01); *G11C 16/10* (2013.01)

(58) Field of Classification Search
CPC ..................................................... G11C 11/56
USPC ..................................................... 365/185.22
See application file for complete search history.

(56) References Cited

U.S. PATENT DOCUMENTS

| | | |
|---|---|---|
| 10,026,483 B1 | 7/2018 | Shah et al. |
| 10,276,252 B2 | 4/2019 | Madraswala et al. |
| 2015/0170746 A1 * | 6/2015 | Oowada .................. G11C 16/10 365/185.18 |
| 2017/0200492 A1 | 7/2017 | Yang et al. |
| 2018/0090216 A1 * | 3/2018 | Hahn .................. G11C 11/5671 |
| 2019/0043596 A1 * | 2/2019 | Madraswala ............ G11C 7/04 |
| 2019/0050153 A1 | 2/2019 | Yang et al. |
| 2020/0293203 A1 | 9/2020 | Rayaprolu et al. |
| 2020/0301602 A1 | 9/2020 | Kurosawa |

FOREIGN PATENT DOCUMENTS

JP  2020-155167 A  9/2020

* cited by examiner

*Primary Examiner* — Muna A Techane
(74) *Attorney, Agent, or Firm* — Oblon, McClelland, Maier & Neustadt, L.L.P.

(57) ABSTRACT

A memory device includes control circuitry that executes a first programming operation and executes a second programming operation after the first programming operation. The first programming operation includes setting a threshold voltage of each of a second set of memory cells in a second section corresponding to write data, and setting a threshold voltage of each of the third set of memory cells in a third section. The second programming operation includes setting the threshold voltage of each of the second set of memory cells in a fifth section corresponding to the write data, and setting the threshold voltage of each of the third set of memory cells in a sixth section or a seventh section among a plurality of fourth sections in accordance with temperature information. The sixth section includes the same voltage range as the third section. The seventh section is higher in voltage than the third section.

17 Claims, 26 Drawing Sheets

|        | LOWER BIT | MIDDLE BIT | UPPER BIT |
|--------|-----------|------------|-----------|
| R0 (S0) | 1 | 1 | 1 |
| R1 (S1) | 0 | 1 | 1 |
| R2 (S2) | 0 | 0 | 1 |
| R3 (S3) | 0 | 0 | 0 |
| R4 (S4) | 0 | 1 | 0 |
| R5 (S5) | 1 | 1 | 0 |
| R6 (S6) | 1 | 0 | 0 |
| R7 (S7) | 1 | 0 | 1 |

FIG.9

|  | TEMP-b | LOWER BIT | MIDDLE BIT | UPPER BIT |
|---|---|---|---|---|
| FOGGY PRO-GRAMMING OPERATION | 0 | 1 | 1 | 1 |
|  | 1 | 1 | 1 | 1 |
| FINE PRO-GRAMMING OPERATION | 0 | 0 | 1 | 1 |
|  | 1 | 1 | 1 | 1 |

FIG.13

|  | TEMP-b | LOWER BIT | MIDDLE BIT | UPPER BIT |
|---|---|---|---|---|
| FOGGY PRO-GRAMMING OPERATION | 0 | 1 | 1 | 1 |
|  | 1 | 1 | 1 | 1 |
| FINE PRO-GRAMMING OPERATION | 0 | 0 | 0 | 0 |
|  | 1 | 1 | 1 | 1 |

FIG.15

|  | TEMP-b | LOWER BIT | MIDDLE BIT | UPPER BIT |
|---|---|---|---|---|
| FOGGY PRO-GRAMMING OPERATION | 0 | 0 | 1 | 1 |
|  | 1 | 0 | 1 | 1 |
| FINE PRO-GRAMMING OPERATION | 0 | 0 | 0 | 1 |
|  | 1 | 0 | 1 | 1 |

FIG.17

|  | TEMP-b | LOWER BIT | MIDDLE BIT | UPPER BIT |
|---|---|---|---|---|
| FOGGY PRO-GRAMMING OPERATION | 0 | 0 | 0 | 1 |
|  | 1 | 1 | 1 | 1 |
| FINE PRO-GRAMMING OPERATION | 0 | 0 | 0 | 1 |
|  | 1 | 0 | 1 | 0 |

FIG.20

|  |  | LOWER BIT | MIDDLE BIT | UPPER BIT |
|---|---|---|---|---|
| R0 (S0) | R0" (S0") | 1 | 1 | 1 |
| R1 (S1) |  | 1 | 1 | 0 |
| R2 (S2) | R1" (S1") | 1 | 0 | 0 |
| R3 (S3) |  | 1 | 0 | 1 |
| R4 (S4) | R2" (S2") | 0 | 0 | 1 |
| R5 (S5) |  | 0 | 0 | 0 |
| R6 (S6) | R3" (S3") | 0 | 1 | 0 |
| R7 (S7) |  | 0 | 1 | 1 |

WRITING BY MLC PROGRAMMING OPERATION

WRITING BY FINE PROGRAMMING OPERATION

FIG.22

|  | TEMP-b | LOWER BIT | MIDDLE BIT | UPPER BIT |
|---|---|---|---|---|
| MLC PRO-GRAMMING OPERATION | 0 | 1 | 1 | Don't Care |
|  | 1 | 1 | 0 | Don't Care |
| FINE PRO-GRAMMING OPERATION | 0 | IDL | IDL | 0 |
|  | 1 | IDL | IDL | 1 |

FIG.27

|  |  | TEMP-b | LOWER BIT | MIDDLE BIT | UPPER BIT |
|---|---|---|---|---|---|
| ARtemp0 | FOGGY PRO-GRAMMING OPERATION | 0 | 0 | 0 | 0 |
|  |  | 1 | 1 | 1 | 1 |
|  | FINE PRO-GRAMMING OPERATION | 0 | 0 | 0 | 0 |
|  |  | 1 | 1 | 1 | 1 |
| ARtemp1 | FOGGY PRO-GRAMMING OPERATION | 0 | 1 | 1 | 1 |
|  |  | 1 | 1 | 1 | 1 |
|  | FINE PRO-GRAMMING OPERATION | 0 | 0 | 1 | 1 |
|  |  | 1 | 1 | 1 | 1 |

NONVOLATILE MEMORY

CROSS-REFERENCE TO RELATED APPLICATIONS

This application is based upon and claims the benefit of priority from Japanese Patent Application No. 2022-042300 filed on Mar. 17, 2022; the entire contents of which are incorporated herein by reference.

FIELD

Embodiments described herein relate generally to a nonvolatile memory.

BACKGROUND

Operation characteristics of nonvolatile memory such as NAND flash memory may vary depending on a use temperature. In addition, temperature recording as to the nonvolatile memory in write operations can be used for failure analysis. It is thus desirable to correctly record temperatures of the nonvolatile memory in the write operations.

BRIEF DESCRIPTION OF THE DRAWINGS

FIG. 9 is a diagram illustrating 3-bit data generated in a programming operation to the temperature storage region ARtemp according to the first embodiment;

FIG. 13 is a diagram illustrating 3-bit data generated in a programming operation to the temperature storage region ARtemp according to the first modification of the first embodiment;

FIG. 15 is a diagram illustrating 3-bit data generated in a programming operation to the temperature storage region ARtemp according to the second modification of the first embodiment;

FIG. 17 is a diagram illustrating 3-bit data generated in a programming operation to the temperature storage region ARtemp according to the second embodiment;

FIG. 20 is a diagram illustrating an example of data coding according to the third embodiment;

FIG. 22 is a diagram illustrating data generated in a programming operation to the temperature storage region ARtemp according to the third embodiment;

FIG. 27 is a diagram illustrating 3-bit data generated in a programming operation to temperature storage regions ARtemp0 and ARtemp1 according to the fourth embodiment.

DETAILED DESCRIPTION

Figure 1:
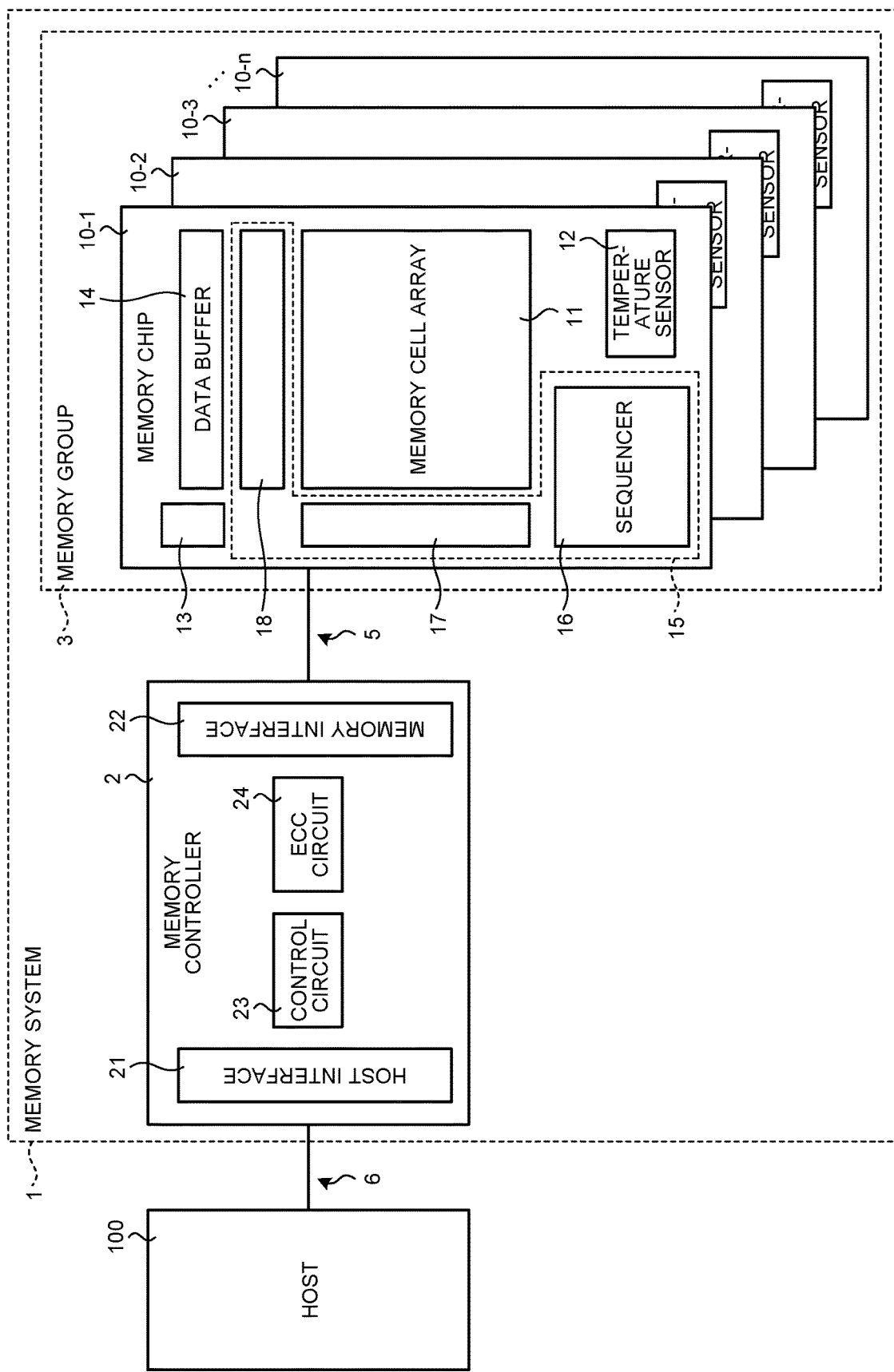
FIG. 1 is a schematic diagram illustrating an exemplary configuration of a memory system including a memory chip according to a first embodiment.

According to one embodiment, a memory device comprises includes a first set of memory cells, a temperature sensor, an interface, and control circuitry. Each of the first set of memory cells has a gate connected to a word line, and is configured to store data in a non-volatile manner corresponding to a threshold voltage thereof. The first set of memory cells includes a second set of memory cells and a third set of memory cells different from the second set of memory cells. The interface is configured to receive write data. The control circuitry is configured to execute a first programming operation and execute a second programming operation after the first programming operation. The first programming operation includes, by applying a programming voltage to the word line, setting the threshold voltage of each of the second set of memory cells in a second section corresponding to the write data among a plurality of first sections, and setting the threshold voltage of each of the third set of memory cells in a third section among the plurality of first sections. The second programming operation includes, by applying a programming voltage to the word line, setting the threshold voltage of each of the second set of memory cells in a fifth section corresponding to the write data among a plurality of fourth sections, the plurality of fourth sections being wider in voltage range than the plurality of first sections, and setting the threshold voltage of each of the third set of memory cells in a sixth section or a seventh section among the plurality of fourth sections in accordance with the first temperature information detected by the temperature sensor, the sixth section including the same voltage range as the third section, the seventh section being higher in voltage range than the third section.

A nonvolatile memory according to one embodiment stores data in a nonvolatile manner. The storage reliability of the nonvolatile memory depends on use temperature. For example, a detection voltage Vsense that minimizes the number of error bits fluctuates depending on temperatures of the nonvolatile memory in a write operation and in a read operation.

A technique to be compared with embodiments will be now described. The technique to be compared is referred to as a comparative example. According to the comparative example, the nonvolatile memory performs no correction by temperature or determines the detection voltage Vsense based on a temperature detected by the temperature sensor in the read operation.

The nonvolatile memory may fail to correctly determine the detection voltage Vsense based on the temperature in the read operation. For example, if the temperature greatly differs in data write operation and in data read operation, i.e., a temperature crossing occurs, the detection voltage Vsense obtained based on the temperature in the read operation deviates from a correct detection voltage Vsense, i.e., the detection voltage Vsense serving to minimize the number of error bits. In this case the number of error bits may increase in the memory system of the comparative example.

In the comparative example, a memory controller is disposed outside the nonvolatile memory to control and record temperature information in the write operation. For example, the nonvolatile memory detects temperature in response to receipt of a temperature-status acquisition command from the memory controller. The nonvolatile memory returns the detected temperature information to the memory controller. The temperature information is written as metadata to a memory cell array of the nonvolatile memory in response to the command from the memory controller. In this case, a time lag may occur between the temperature detection and data writing. This makes it difficult to properly correct the temperature crossing by using the temperature detected in the read operation and the temperature information contained in the metadata.

In addition, the memory controller controls the temperature in units (for example, in units of blocks) larger than units of data writing. Because of this, the temperatures contained in the metadata to which the memory controller refers in units of data writing may possibly deviate greatly from the temperatures in the write operation. From this point of view as well, it is difficult to properly correct the temperature crossing by using the temperature detected in the read operation and the temperature information contained in the metadata.

Further, the recorded use temperatures of the nonvolatile memory are important information for failure analysis. The comparative example controls and records the temperature information in units larger than units of data writing. Thus, with reference to the temperature information in units of data writing for failure analysis, the memory controller cannot obtain correct temperatures related to the write operation.

In view of this, the nonvolatile memory of the present embodiment includes control circuitry configured to write temperature information detected by a built-in temperature sensor to a redundant storage region in a memory cell array at the time of writing data to the memory cell array. This enables proper recording and control of temperature information related to data write operations.

Hereinafter, nonvolatile memories according to embodiments will be described in detail with reference to the accompanied drawings. The embodiments are presented for illustrative purpose only and not intended to limit the scope of the inventions.

First Embodiment

FIG. 1 is a schematic diagram illustrating an exemplary configuration of a memory system 1 including memory chips 10 according to a first embodiment.

The memory system 1 is communicably connected to a host 100 and functions as an external storage for the host 100. Examples of the memory system 1 include a memory card and a solid state drive (SSD). The host 100 may be an information processing device described below such as a personal computer, a server, or a storage box; a mobile terminal such as a mobile phone, an imaging device, a tablet computer, or a smartphone; a game device; or an in-vehicle terminal such as a car navigation system.

The memory system 1 includes a memory controller 2 and a memory group 3. The memory controller 2 includes a host interface 21, a memory interface 22, a control circuit 23, and an error checking and correction (ECC) circuit 24. The memory group 3 includes a plurality of memory chips 10-1 to 10-n. Each of the memory chips 10-1 to 10-n (n being integer of 2 or more) is referred to as a memory chip 10. The memory chip 10 is an exemplary nonvolatile memory of an embodiment.

As an example, the memory controller 2 is a semiconductor integrated circuit configured as a system-on-a-chip (SoC). The operation of each element of the memory controller 2 as described below may be implemented by a central processing unit (CPU)'s executing firmware or by hardware.

In the memory controller 2 the memory interface 22 is connected to the memory group 3 via a memory bus 5 while the host interface 21 is connected to the host 100 via a host bus 6. The control circuit 23 receives a host write command from the host 100 via the host interface 21 and controls a write operation to the memory group 3 in accordance with the host write command. The control circuit 23 receives a host read command from the host 100 via the host interface 21 and controls a read operation to the memory group 3 in accordance with the host read command. The host bus 6 may be compliant with any standard such as serial advanced technology attachment (SATA), serial attached SCSI (SAS), or peripheral component interconnect express (PCIe®) including Non-Volatile Memory Express (NVMe®).

The memory bus 5 serves to transmit and receive signals under the memory interface 22. In the case of the memory interface 22 being a NAND interface, examples of this signal may include a chip enable signal CEn, a command latch enable signal CLE, an address latch enable signal ALE, a write enable signal WEn, a read enable signal REn, a ready/busy signal RBn, and an input/output signal I/O.

The chip enable signal CEn is for placing the memory chip 10 in an enable state. The command latch enable signal CLE is for notifying the memory chip 10 of the input signal I/O thereto being a command. The address latch enable signal ALE is for notifying the memory chip 10 of the input signal I/O thereto being an address. The write enable signal WEn is for allowing the memory chip 10 to capture the input signal I/O. The read enable signal REn is for reading the output signal I/O from the memory chip 10. The ready/busy signal RBn indicates a ready state (ready to receive a command from the memory controller 2) or a busy state (unable to receive a command from the memory controller 2) of the memory chip 10. The input/output signal I/O is an 8-bit signal, for example. The input/output signal I/O is an entity of data to be transmitted and received between the memory chip 10 and the memory controller 2, and represents a command, an address, write data (data to be written), and read data (data that has been read), for example.

The ECC circuit 24 performs data encoding and decoding for detection and correction of error in read data. Specifically, the ECC circuit 24 encodes data (write data) to be written to the memory group 3. The ECC circuit 24 decodes data (read data) read from the memory group 3. The ECC circuit 24 detects and corrects error in read data by decoding. Having failed in the error correction, the ECC circuit 24 notifies the control circuit 23 of the failure in the error correction. Encoding and decoding algorithms applicable to the ECC circuit 24 can be any algorithm using a Reed-Solomon (RS) code, a Bose-Chaudhuri-Hocquenghem (BCH) code, or a low density parity check (LDPC) code.

In the write operation, for example, the ECC circuit 24 receives user data to be written to the memory group 3 with a write command under the control of the control circuit 23, generates a parity bit from the user data, and adds the parity bit to the user data to obtain write data. Write data including the parity bit is written to the memory group 3 as encoded data.

In the read operation, under the control of the control circuit 23, the ECC circuit 24 receives read data from the memory group 3 with a read command, and extracts a parity bit from the read data. The ECC circuit 24 generates a syndrome based on the parity bit and determines whether the user data contains an error bit. When determining that the user data contains an error bit, the ECC circuit 24 identifies a location of the error bit. The number of error bits correctable by the ECC circuit 24 depends on the number of parity bits. If the number of error bits contained in the user data matches or is less than the number of correctable error bits, the ECC circuit 24 corrects the error bits and notifies the control circuit 23 of a success of correction. If the number of error bits contained in the user data exceeds the number of correctable error bits, the ECC circuit 24 determines that the error is uncorrectable and notifies the control circuit 23 of a failure of correction.

The memory chips 10 constituting the memory group 3 store data in a nonvolatile manner. Examples thereof includes NAND flash memory (hereinafter, also referred to as a NAND device). The following will describe a NAND device as an example of the memory chip 10, however, the memory group 3 may include a storage medium other than the NAND device, such as three-dimensional flash memory, resistive random access memory (ReRAM), ferroelectric random access memory (FeRAM), or magnetoresistive random access memory (MRAM).

Each memory chip 10 includes a memory cell array 11, a temperature sensor 12, an I/O interface 13, a data buffer 14, and control circuitry 15. The control circuitry 15 includes a sequencer 16, a row module 17, and a column module 18.

The row module 17 includes a row decoder and a driver circuit, and uses the row decoder to select a block to be accessed and select a row from the selected block. The driver circuit supplies a voltage to the selected block via the row decoder.

The column module 18 includes a sense amplifier and a data latch including a plurality of latch circuits. In programming operation the column module 18 writes, to the memory cell array 11, write data supplied from the memory controller 2 to the data latch via the I/O interface 13 and the data buffer 14. In read operation the column module 18 senses data written to the memory cell array 11 for computation. The column module 18 then outputs resultant read data to the memory controller 2 via the data latch, the data buffer 14, and the I/O interface 13.

In this disclosure, the programming operation refers to a series of data write operations to the memory cell array 11 in the memory chip 10. The read operation refers to a series of data read operations to the memory cell array 11 in the memory chip 10. Erase operation refers to data erase operation to the memory cell array 11 in the memory chip 10.

The temperature sensor 12 is disposed around the memory cell array 11 in the memory chip 10, to detect a temperature around the memory cell array 11 and generate a signal TEMP indicating the detected temperature.

The memory cell array 11 includes a plurality of memory cell transistors MT. The memory cell transistors MT are associated with respective rows and columns. The memory cell array 11 stores therein data designated by a write command from the memory controller 2.

Figure 2:
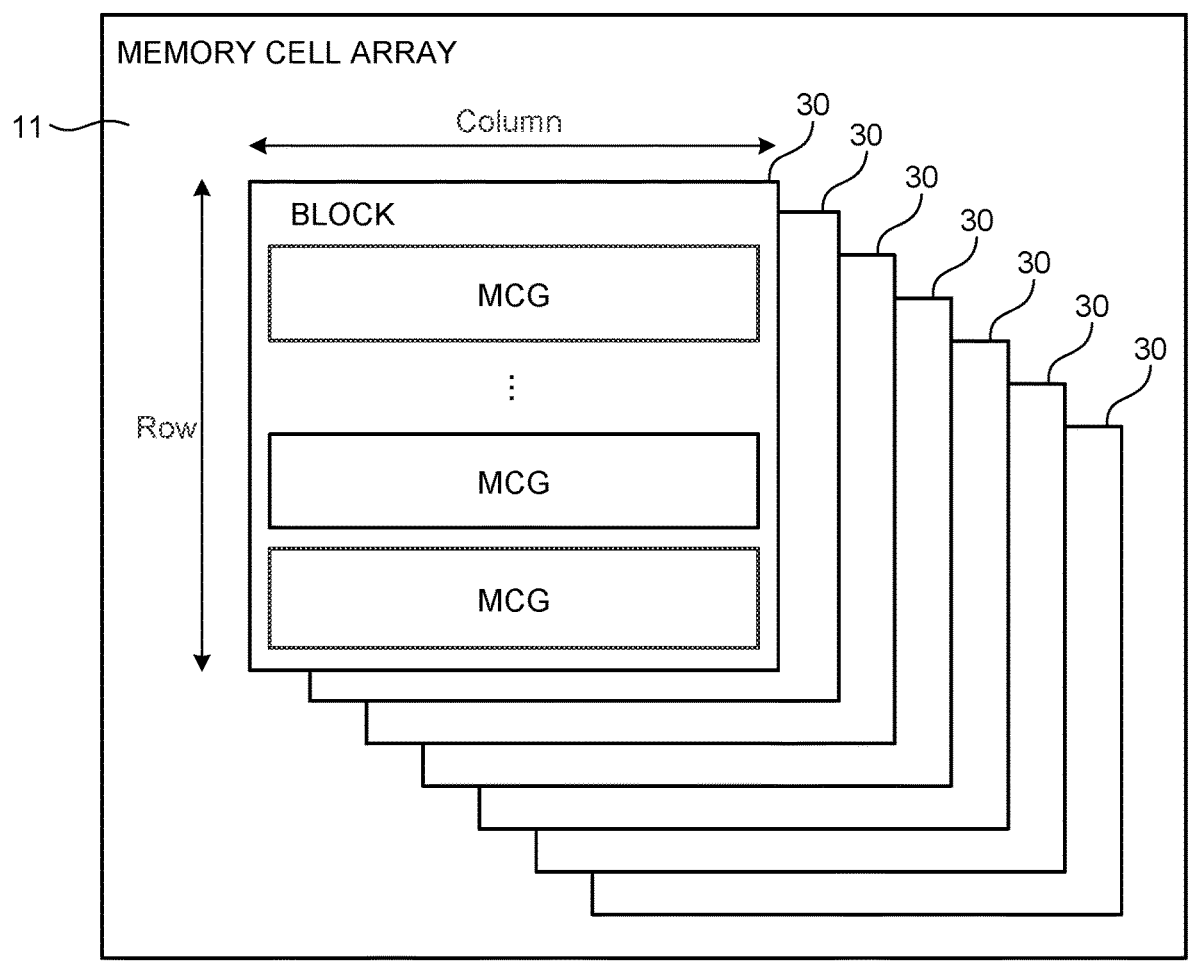
FIG. 2 is a schematic diagram illustrating an exemplary configuration of a memory cell array according to the first embodiment.

FIG. 2 is a schematic diagram illustrating an exemplary configuration of the memory cell array 11 according to the first embodiment.

The memory cell array 11 includes a plurality of blocks 30. Data written in one block 30 is erased collectively. Each block 30 includes a plurality of memory cell groups MCG. Each block is subjected to a programming operation and a read operation in units of the memory cell groups MCG.

Figure 3:
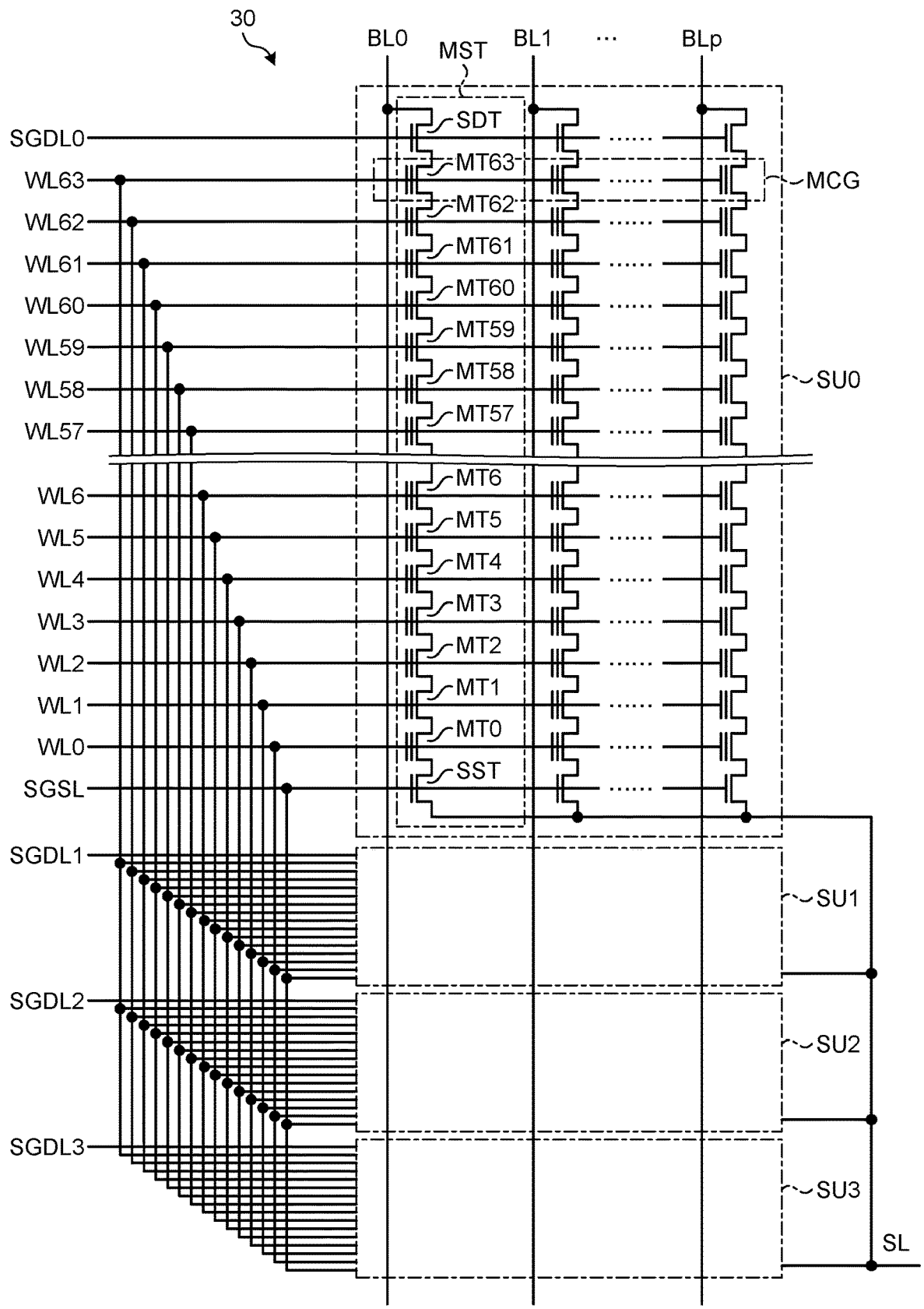
FIG. 3 is a schematic diagram illustrating an exemplary circuit configuration of a block according to the first embodiment.

FIG. 3 is a schematic diagram illustrating an exemplary circuit configuration of the block 30 according to the first embodiment. The blocks have the same circuit configuration.

The block 30 includes a plurality of string units SU0 to SU3. The string units SU0 to SU3 correspond to a plurality of select gate lines SGDL0 to SGDL3 and share a select gate line SGSL. Each of the string units SU0 to SU3 functions as a drive unit in the block 30. Each string unit SU0 to SU3 can be driven via the corresponding select gate lines SGDL0 to SGDL3 and the select gate line SGSL. Each of the string units SU0 to SU3 includes a plurality of memory strings MST.

Each memory string MST includes, for example, 64 memory cell transistors MT (MT0 to MT63) and select transistors SDT and SST. Each memory cell transistor MT includes a control gate and a charge storage film, to hold data in a nonvolatile manner. The 64 memory cell transistors MT (MT0 to MT63) are connected in series between a source of the select transistor SDT and a drain of the select transistor SST. The number of memory cell transistors MT in the memory string MST is not limited to 64.

The word lines WL0 to WL63 commonly connect the control gates of the memory cell transistors MT among the memory strings MST in the string units SU of the block 30. Specifically, in each string unit SU of the block 30 the control gates of the memory cell transistors MT in the same row are connected to the same word line WL. The string unit SU of the block 30 thus includes a plurality of memory cell groups MCG corresponding to a plurality of word lines WL. Each memory cell group MCG includes (p+1) memory cell transistors MT connected to the same word line WL.

The memory cell group MCG are individually subjected to a programming operation and a read operation. Aggregated data of 1-bit data to be written to all the memory cell transistors MT is handled as a page.

Hereinafter, the memory cell transistor MT is simply referred to as a memory cell MT.

In the programming operation, the threshold voltage of each memory cell MT is set in a section corresponding to data. More specifically, a possible threshold voltage range of the memory cell MT is divided into $2^N$ sections associated with different N-bit data where N is an integer of one or more. In the programming operation the threshold voltage of the memory cell MT concerned is set in a section corresponding to data among the $2^N$ sections by injecting a charge into the charge storage layer of the memory cell MT.

In the read operation, one or more voltages at the boundary between adjacent sections are sequentially applied as the detection voltage Vsense to identify a section including the threshold voltage of the memory cell MT concerned. Data corresponding to the identified section is acquired as data stored in the memory cell MT.

The memory cell MT can store data of one or more bits. The memory cell MT capable of storing 1-bit data is referred to as a single-level cell (SLC). The memory cell MT capable of storing 2-bit data is referred to as a multi-level cell (MLC). The memory cell MT capable of storing 3-bit data is referred to as a triple-level cell (TLC). The memory cell MT capable of storing 4-bit data is referred to as a quad-level cell (QLC). The memory cell MT capable of storing 5-bit data is referred to as a penta-level cell (PLC).

In some embodiments any level cell is applicable as long as the memory cell MT can store 2-bit or more data. The following will describe a TLC as an example.

Figures 4, 5:
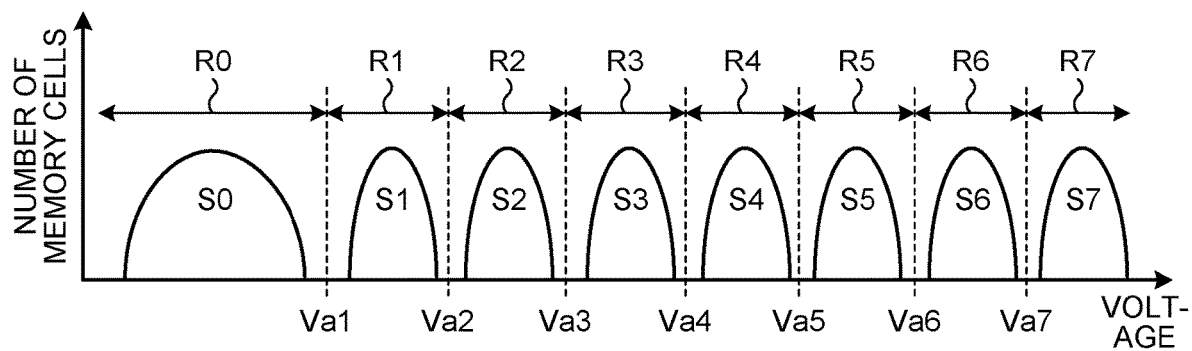
FIG. 4 is a diagram illustrating an example of threshold voltage distributions of memory cells MT in a write operation of the memory chip in a TLC mode according to the first embodiment.
FIG. 5 is a diagram illustrating an example of data coding according to the first embodiment.

FIG. 4 is a diagram illustrating an example of threshold voltage distributions of memory cells MT in a write operation of the memory chip 10 in a TLC mode in the first embodiment.

In the TLC mode, eight sections R0 to R7 associated with different pieces of 3-bit data are set.

For example, a section R0 up to voltage Va1 is set on the lowest voltage side. On the higher voltage side of the section R0, a section R1 from voltage Va1 to voltage Vc2, a section R2 from voltage Va2 to voltage Va3, a section R3 from voltage Va3 to voltage Vc4, a section R4 from voltage Va4 to voltage Va5, a section R5 from voltage Va5 to voltage Vc6, a section R6 from voltage Va6 to voltage Va7, and a section R7 from voltage Va7 are set in order.

In the programming operation the threshold voltage of each memory cell MT is set within a section corresponding to data. As a result, the threshold voltage distribution of multiple memory cells MT is of a lobe form in each section. A section RX may be referred to as a state SX where X is an integer of two or more. In the example illustrated in FIG. 4, X is defined as an integer of 0 to 7.

In the erase operation the threshold voltage of each memory cell MT is set in a state S0, i.e., lower than the voltage Va1. The state S0 is thus regarded as a data erased state. The threshold voltage of the memory cell MT is set in any of the states S0 to S7 by the programming operation after the erase operation. Note that the threshold voltage of the memory cell MT set in the state S0 is synonymous with the memory cell MT as maintained in the state S0 without increase in threshold voltage.

In the read operation the voltage corresponding to the boundary between the adjacent sections R is set as the detection voltage Vsense. This allows determination as to which section RX (in other words, state SX) includes the threshold voltage of the memory cell MT. For example, the voltages Va1, Va2, Va3, Va4, Va5, Va6, and Va7 illustrated in FIG. 4 are used as the detection voltages Vsense.

In the TLC mode each memory cell MT stores 3-bit data. Among the three bits, a least significant bit (LSB) is referred to as a lower bit, a most significant bit (MSB) is referred to as an upper bit, and a bit between the LSB and the MSB is referred to as a middle bit. In addition, aggregated data of lower bit data out of the 3-bit data in all the memory cell groups MCG is referred to as a lower page. Aggregated data of upper bit data of the 3-bit data in all the memory cell groups MCG is referred to as an upper page. Aggregated data of the middle bit data out of the 3-bit data in all the memory cell groups MCG is referred to as a middle page.

As described above, the respective sections RX (i.e., states SX) in which the threshold voltages can be set are individually associated with data. The correspondence between the sections RX and the data is referred to as data coding.

FIG. 5 is a diagram illustrating an example of data coding according to the first embodiment. Herein, when data is denoted by "abc", "a" represents a lower bit value, "b" represents a middle bit value, and "c" represents an upper bit value.

According to the exemplary data coding illustrated in FIG. 5, data "111" is associated with the section R0, data "011" is associated with the section R1, data "001" is associated with the section R2, data "000" is associated with the section R3, data "010" is associated with the section R4, data "110" is associated with the section R5, data "100" is associated with the section R6, and data "101" is associated with the section R7.

The data coding above is merely exemplary. The data coding can be changed in any manner.

The threshold voltage of the memory cell MT may fluctuate due to various factors including inter-cell interference. Thus, the higher voltage side or lower voltage side of the lobe-form distribution in each section RX may partially protrude to the adjacent section RX.

In a situation that the lobe-form distribution in a certain section RX partially protrudes to the adjacent section RX, the read operation results in error, i.e., reading erroneous data from the memory cell MT included in the part protruding to the adjacent section RX. The erroneous data is sent to the memory controller 2 and corrected by the ECC circuit 24 included in the memory controller 2.

There is, however, a limit to the number of error bits that the ECC circuit 24 is able to correct. It is therefore desirable that the threshold voltages of the individual memory cells MT be set within their target sections RX in the programming operation so as not to protrude as much as possible.

In order to prevent the threshold voltages of the memory cells MT from protruding from their target sections R as much as possible, the memory chip 10 is configured to be able to execute multi-stage programming. The multi-stage programming refers to programming in which operation is divided into multiple phases. In the first embodiment, the memory chip 10 executes foggy-fine programming as an example of multi-stage programming.

In a foggy-fine programming operation, all-bit data (for example, 3 bits in the TLC mode) is approximately written to a first memory cell MT. Specifically, the threshold voltage of the first memory cell MT is approximately set according to the all-bit data. Then, all-bit data is approximately written to a second memory cell MT adjacent to the first memory cell MT. In other words, all-bit data is approximately written to the second memory cell MT connected to the word line WL adjacent to the word line WL to which the first memory cell MT is connected. All-bit data is accurately rewritten to the first memory cell MT. Specifically, the memory cells MT are individually subjected to a first-stage programming operation in which all-bit data is approximately written and a second-stage programming operation in which all-bit data is accurately rewritten.

It is possible to set the threshold voltage of each memory cell MT accurately by the second-stage programming operation of the foggy-fine programming operation. The foggy-fine programming operation enables a decrease in shift amount of the threshold voltage of each memory cell. This makes it possible to reduce inter-cell interference between the adjacent memory cells MT, leading to prevent or reduce the fluctuation in the threshold voltage caused by the inter-cell interference. In other words, it is possible to avoid the threshold voltage of each memory cell MT from protruding from the target section RX due to the inter-cell interference.

Figure 6:
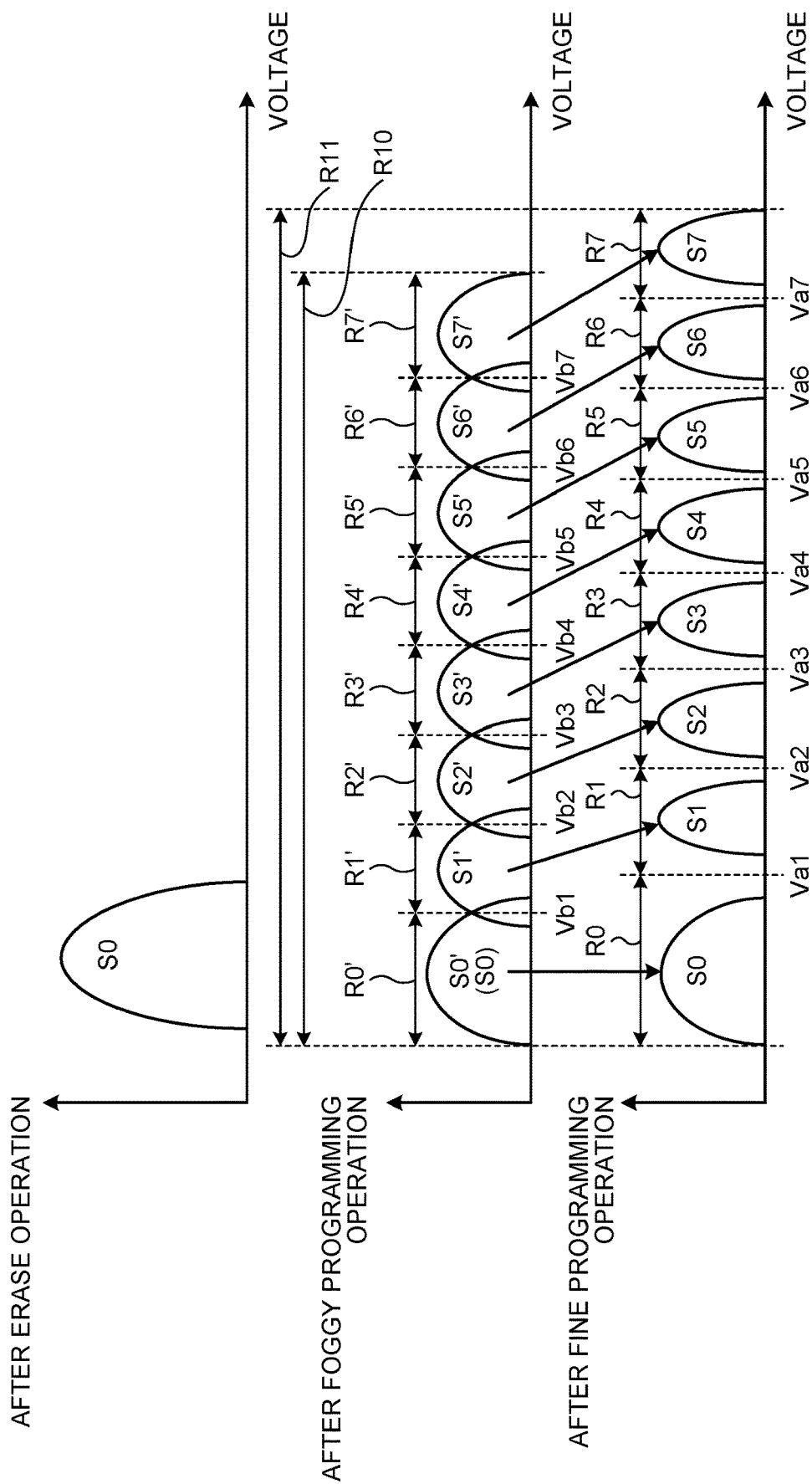
FIG. 6 is a schematic diagram illustrating variation in threshold voltage distribution due to the foggy-fine programming operation executed by the memory chip according to the first embodiment.

FIG. 6 schematically illustrates a variation in threshold voltage distribution due to the foggy-fine programming operation executed by the memory chip 10 in the first embodiment. FIG. 6 depicts three graphs representing variations in threshold voltage distributions of the memory cells MT constituting one memory cell group MCG. In each graph, the horizontal axis represents voltage and the vertical axis represents the number of memory cells MT.

After the erase operation, the threshold voltages of all the memory cells MT in the block 30 are in the state S0. In particular, before start of the programming operation after the erase operation, the lobe-form distribution largely spreads in the range of the lowest voltage side (e.g., lower than Va1), as illustrated in the uppermost graph of FIG. 6.

After the erase operation the memory cell group MCG is subjected to the first-stage programming operation. The first-stage programming operation in the foggy-fine programming operation is referred to as a foggy programming operation.

In the foggy programming operation, the threshold voltages of the individual memory cells MT are approximately set so as to be as close as possible to their target sections RX among the eight sections R0 to R7.

In detail, sections R0' to R7' are set. The section R0' substantially matches the section R0. The section R1' is slightly shifted from the section R1 to the lower voltage side. The section R2' is slightly shifted from the section R2 to the lower voltage side. The section R3' is slightly shifted from the section R3 to the lower voltage side. The section R4' is slightly shifted from the section R4 to the lower voltage side. The section R5' is slightly shifted from the section R5 to the lower voltage side. The section R6' is slightly shifted from the section R6 to the lower voltage side. The section R7' is slightly shifted from the section R7 to the lower voltage side.

Specifically, in the example illustrated in FIG. 6 the sections R0' to R7' are as follows. The section R0' is up to voltage Va1. The section R1' ranges from voltage Vb1 where Vb1<Va1 to voltage Vb2 where Vb2<Va2. The section R2' ranges from voltage Vb2 to voltage Vb3 where Vb3<Va3. The section R3' ranges from voltage Vb3 to voltage Vb4 where Vb4<Va4. The section R4' ranges from voltage Vb4 to voltage Vb5 where Vb5<Va5. The section R5' ranges from voltage Vb5 to voltage Vb6 where Vb6<Va6. The section R6' ranges from voltage Vb6 to voltage Vb7 where Vb7<Va7. The section R7' ranges from voltage Vb7. The sections R1' to R7' are slightly shifted from the sections R1 to R to the lower voltage side, therefore, a range R10 from the sections R1' to R7' is narrower than a range R11 from the sections R1 to R7.

In the foggy programming operation the threshold voltage of the memory cell MT to be finally set in the section RX is set in the section RX'. Thereby, the threshold voltage of each memory cell MT is included in any of the sections R0' to R7'. A finally set section by the second-stage programming operation (fine programming operation in this example) may be referred to as a final target section. A section set by the first-stage programming operation (in this example, foggy programming operation) such as the section RX' may be referred to as an intermediate target section.

The threshold voltage of the memory cell MT can be raised by applying a pulsed programming voltage (also referred to as a programming pulse) to the gate of the memory cell MT concerned via the word line WL. In the foggy programming operation either or both of voltage and pulse width of one programming pulse are set such that the threshold voltage of the memory cell MT per programming pulse application is to exhibit a larger amount of shift than in the fine programming operation as described below. Thus, the foggy programming operation allows a great shift in the threshold voltage in a short period of time. Due to a large amount of shift in the threshold voltage of the memory cell MT per programming pulse application, however, the threshold voltage may not fall within the intermediate target section.

Further, the threshold voltage of a designated memory cell MT can be set within the intermediate target section through the foggy programming operation, however, it may fluctuate beyond the intermediate target section due to inter-cell interference between the designated memory cell MT and the adjacent memory cell MT. As illustrated in the middle graph of FIG. 6, thus, the eight lobe-form distributions corresponding to the sections R0' to R7' may protrude from the boundaries of the corresponding sections after the foggy programming operation.

Hereinafter, the section RX' may be sometimes referred to as a state SX'.

The threshold voltage of the memory cell MT whose final target section is the section R0 is not actually raised in the foggy programming operation. Thus, the threshold voltage of the memory cell MT whose final target section is the section R0 is maintained in the state S0 in the foggy programming operation. In the example illustrated in FIG. 6, the state S0' matches the state S0.

The second-stage programming operation is executed after the foggy programming operation. The second-stage programming operation in the foggy-fine programming operation is referred to as a fine programming operation.

In the fine programming operation the threshold voltage of each memory cell MT is set in the final target section RX. In the fine programming operation, either or both of voltage and pulse width of one programming pulse are set such that the threshold voltage is to exhibit a smaller amount of shift per programming pulse application than in the foggy programming operation.

Due to a smaller amount of shift in the threshold voltage per programming pulse application in the fine programming operation than in the foggy programming operation, the distributions can be made narrower in shape in the fine programming operation. In other words, it is possible to finely set the threshold voltages of the memory cells MT to prevent, as much as possible, their distributions from protruding from the corresponding sections RX.

In addition, by performing the foggy programming operation before the fine programming operation, the threshold voltage of each memory cell MT can be closer to the final target section RX than that of each memory cell MT after the erase operation. This leads to reducing the amount of shift in the threshold voltage of each memory cell MT in the fine programming operation. Thus, the fine programming operation can reduce the inter-cell interference.

The fine programming operation causes a small amount of shift in the threshold voltage of the memory cell MT per programming pulse application. Thus, it may take a relatively longer time to vary the threshold voltage of the memory cell MT by the fine programming operation alone. However, execution of the foggy programming operation in advance reduces the total amount of shift in the threshold voltage of each memory cell MT in the fine programming operation, which can avoid an increase in the time required for completion of the fine programming operation.

As described above, the memory cell array 11 is subjected to the write operation in units of memory cell groups MCG. In the first embodiment, the memory chip 10 writes temperature information TEMP to a part of the memory cells MT of the memory cell group MCG concerned every time data is written to the memory cell group MCG.

Figure 7:
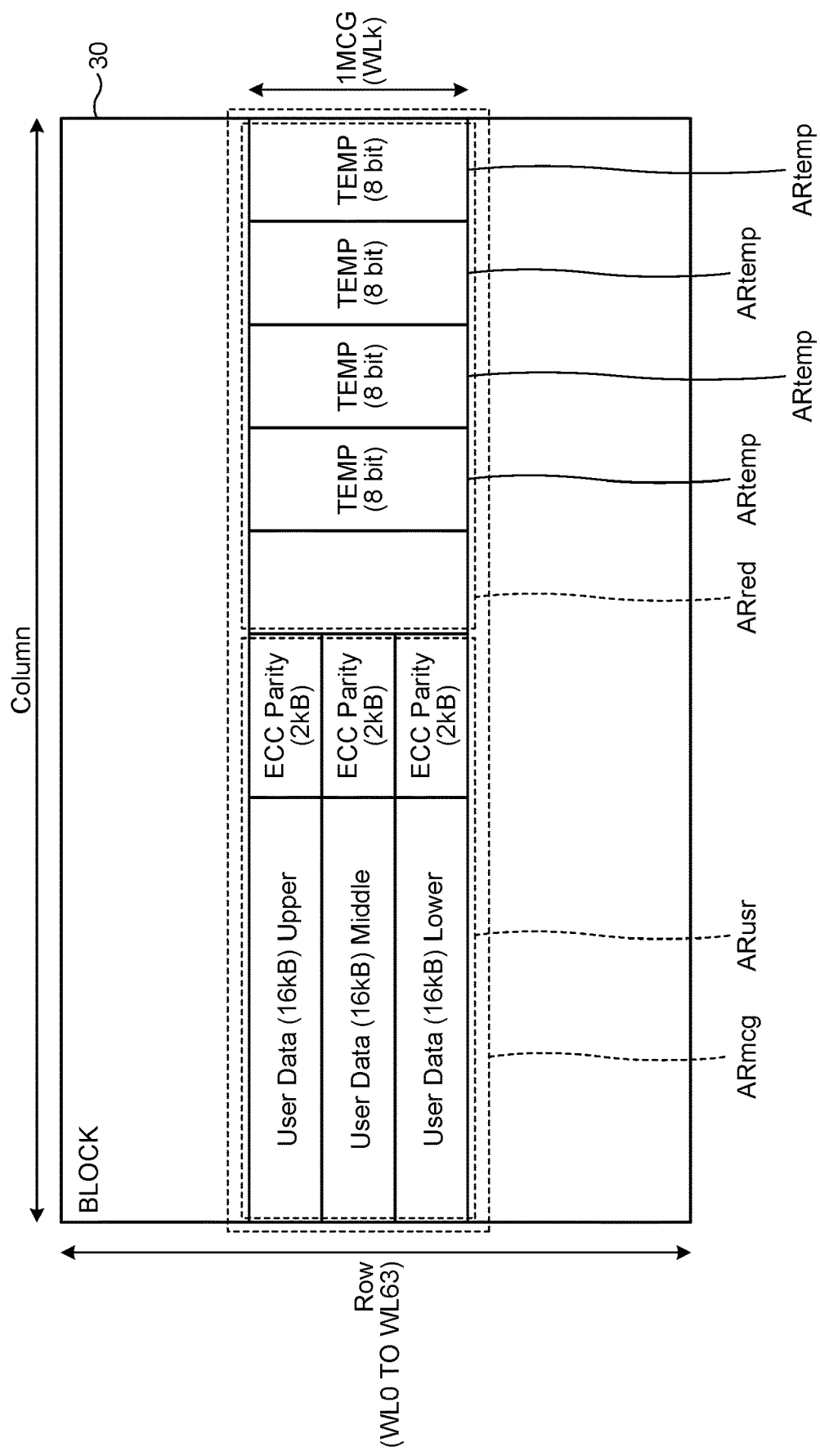
FIG. 7 is a schematic diagram illustrating an exemplary write location of temperature information TEMP in a memory cell group MCG according to the first embodiment.

FIG. 7 is a schematic diagram illustrating an exemplary write location of the temperature information TEMP in the memory cell group MCG in the first embodiment.

The memory cell group MCG constitutes a storage region ARmcg. Part of the memory cells MT in the memory cell group MCG forms a redundant region ARred, and the rest of the memory cells MT form a user region ARusr to which data received from the memory controller 2 is written.

The block 30 includes a plurality of redundant memory cells MT in preparation for occurrence of a failure. The memory cell groups MCG in the block 30 each include a number of memory cells MT more than a required number. At the time of occurrence of a failure in any of the memory cells MT assigned to the user region ARusr, the function of the failed memory cell MT is replaced with one of the redundant memory cells MT. In principle the memory controller 2 cannot write data to the redundant memory cells MT unless the redundant memory cells MT have replaced the failed memory cell MT. A redundant region ARred is a storage region constituted of memory cells MT having not replaced the failed memory cell MT among the redundant memory cells MT.

Three-page (i.e., upper page, middle page, and lower page) user data and ECC parity bits generated from the three-page user data are written to the user region ARusr. As an example, the user data of each page has a size of 16 kByte, and the ECC parity bit generated from the user data of each page has a size of two kByte, although the size of each data is not limited to this example.

The redundant region ARred includes a plurality of temperature storage regions ARtemp. The temperature information TEMP is multiplexed into a plurality of pieces, and the pieces of temperature information TEMP are individually written to the temperature storage regions ARtemp. In this example, the redundant region ARred includes four temperature storage regions ARtemp, and the temperature information TEMP is multiplexed into four pieces for writing.

In addition, in this example the temperature information TEMP represents temperatures in 8 bits in the range from minus 127 degrees Celsius to 127 degrees Celsius. The bit string length of the temperature information TEMP and the representable temperature range are not limited this example.

The foggy-fine programming operation is based on the premise that data to be written be the same in the foggy programming operation and in the fine programming operation. In the first embodiment, this premise holds as to writing data to the user region ARusr while the premise does not hold as to writing the temperature information TEMP to the redundant region ARred.

In the programming operation, the memory chip 10 can maintain or raise the threshold voltages of the memory cells MT but cannot lower them. Specifically, after raising the threshold voltage of the memory cell MT in the foggy programming operation, the memory chip 10 cannot set a threshold lower than the raised threshold to the memory cell MT in the fine programming operation. In view of this, the memory controller 2 writes the temperature information TEMP not in the foggy programming operation but in the fine programming operation in the first embodiment.

Furthermore, in the first embodiment the memory chip 10 writes 1-bit temperature information TEMP per memory cell MT. One temperature storage region RAtemp includes eight memory cells MT. Thus, one temperature storage region RAtemp can store 8-bit information. One piece of temperature information TEMP is 8-bit information. Four pieces of temperature information TEMP (32 bits) are retained in the four temperature storage regions RAtemp (32 memory cells MT in total). Hereinafter, a 1-bit value of each of digits constituting the temperature information TEMP is referred to as a temperature bit value TEMP-b.

Figure 8:
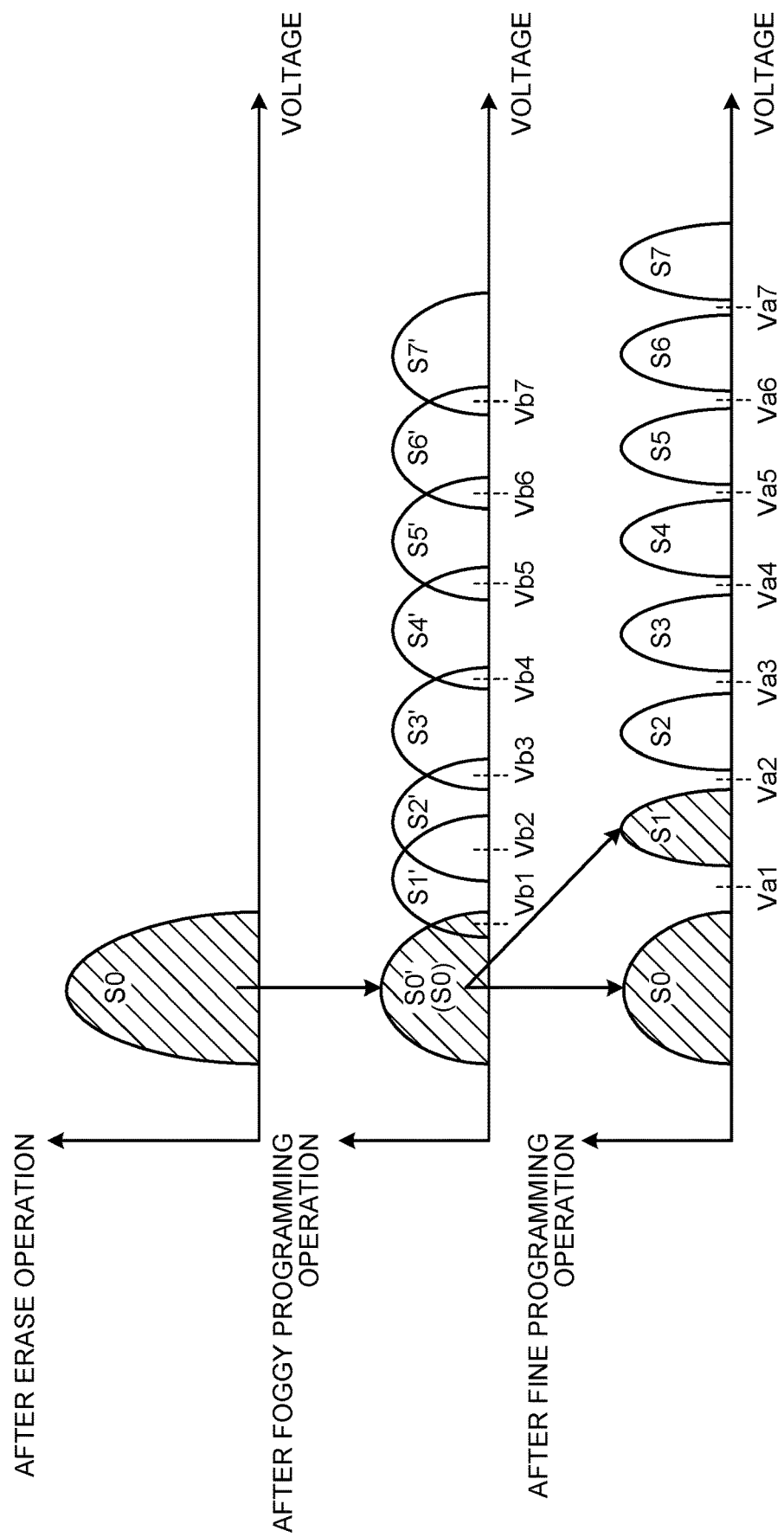
FIG. 8 is a schematic diagram illustrating an example of shift in the threshold voltage of the memory cells MT constituting a temperature storage region ARtemp according to the first embodiment.

FIG. 8 schematically illustrates an example of shift in the threshold voltages of the memory cells MT constituting the temperature storage region ARtemp in the first embodiment. In FIG. 8 distributions that may include the memory cells MT constituting the temperature storage region ARtemp are indicated by hatching. Referring to FIG. 8, the memory cells MT constituting the temperature storage region ARtemp are simply referred to as memory cells MT unless otherwise specified.

In the foggy programming operation, the threshold voltages of the memory cells MT are set in the lowest voltage side of the section R0', i.e., state S0' regardless of the temperature bit value TEMP-b written to the memory cells MT. Specifically, in the foggy programming operation the threshold voltages of the memory cells MT are not raised. The threshold voltages of the memory cells MT are maintained in the state S0', i.e., state S0.

In the subsequent fine programming operation, the threshold voltages of the memory cells MT are set in the state S0 or the state S1 in accordance with the temperature bit value TEMP-b. As an example, when the temperature bit value TEMP-b is 1, the threshold voltages of the memory cells MT are set in the state S0. When the temperature bit value TEMP-b is zero, the threshold voltages of the memory cells MT are set in the state S1. The designer can freely determine the correspondence between the temperature bit values TEMP-b and the two states S0 and S1.

According to the exemplary threshold voltage shift illustrated in FIG. 8, in the fine programming operation, the amount of threshold voltage shift of the memory cells MT corresponds to the amount from the state S0' (i.e., state S0) to the state S1 at a maximum. Thus, in the fine programming operation, the amount of threshold voltage shift of the memory cells MT is sufficiently smaller than the range R10 including the section R0 to the section R7. This results in reducing inter-cell interference acting on the temperature storage region ARtemp.

In addition, since the amount of threshold voltage shift of the memory cells MT is sufficiently small in the fine programming operation, it is possible to reduce the time required for the memory controller 2 to complete the fine programming operation to the memory cell MT.

As described above, the states S0 to S7 are individually associated with 3-bit data. In this regard, to set the threshold voltages of the memory cells MT constituting the temperature storage region ARtemp in the state S0 or the state S1, 3-bit data corresponding to the state S0 or the state S1 is actually written to the memory cells MT via the column module 18 in place of the temperature bit values TEMP-b. Specifically, the sequencer 16 generates 3-bit data corresponding to the state S0 or the state S1 based on the temperature bit value TEMP-b and the data coding illustrated in FIG. 5. The column module 18 receives the 3-bit data from the sequencer 16 and writes the 3-bit data to the memory cells MT constituting the temperature storage region ARtemp.

FIG. 9 is a diagram illustrating 3-bit data to be generated in the programming operation to the temperature storage region ARtemp in the first embodiment. Referring to FIG. 9, the memory cells MT constituting the temperature storage region ARtemp are simply referred to as memory cells MT unless otherwise specified.

In the foggy programming operation, the sequencer 16 generates data "111" regardless of whether the temperature bit value TEMP-b is 0 or 1 to supply the data "111" to the column module 18. Specifically, values "1", "1", and "1" are written to the lower bit, the middle bit, and the upper bit of the memory cell MT, respectively. Thus, the threshold voltage of the memory cell MT is set in the state S0' (S0) regardless of whether the temperature bit value TEMP-b retained in the memory cell MT is 0 or 1.

In the fine programming operation, when the temperature bit value TEMP-b is zero, the sequencer 16 generates data "011" and supplies the data "011" to the column module 18. Specifically, values "0", "1", and "1" are written to the lower bit, the middle bit, and the upper bit of the memory cell MT, respectively. Thus, the threshold voltage of the memory cell MT is set in the state S1 corresponding to the temperature bit value TEMP-b of 0. When the temperature bit value TEMP-b is 1, the sequencer 16 generates data "111" and supplies the data "111" to the column module 18. Specifically, values "1", "1", and "1" are written to the lower bit, the middle bit, and the upper bit of the memory cell MT, respectively. Thus, the threshold voltage of the memory cell MT is set in the state S0 corresponding to the temperature bit value TEMP-b of 1.

Next, an operation of the memory system 1 according to the first embodiment will be described.

Figure 10:
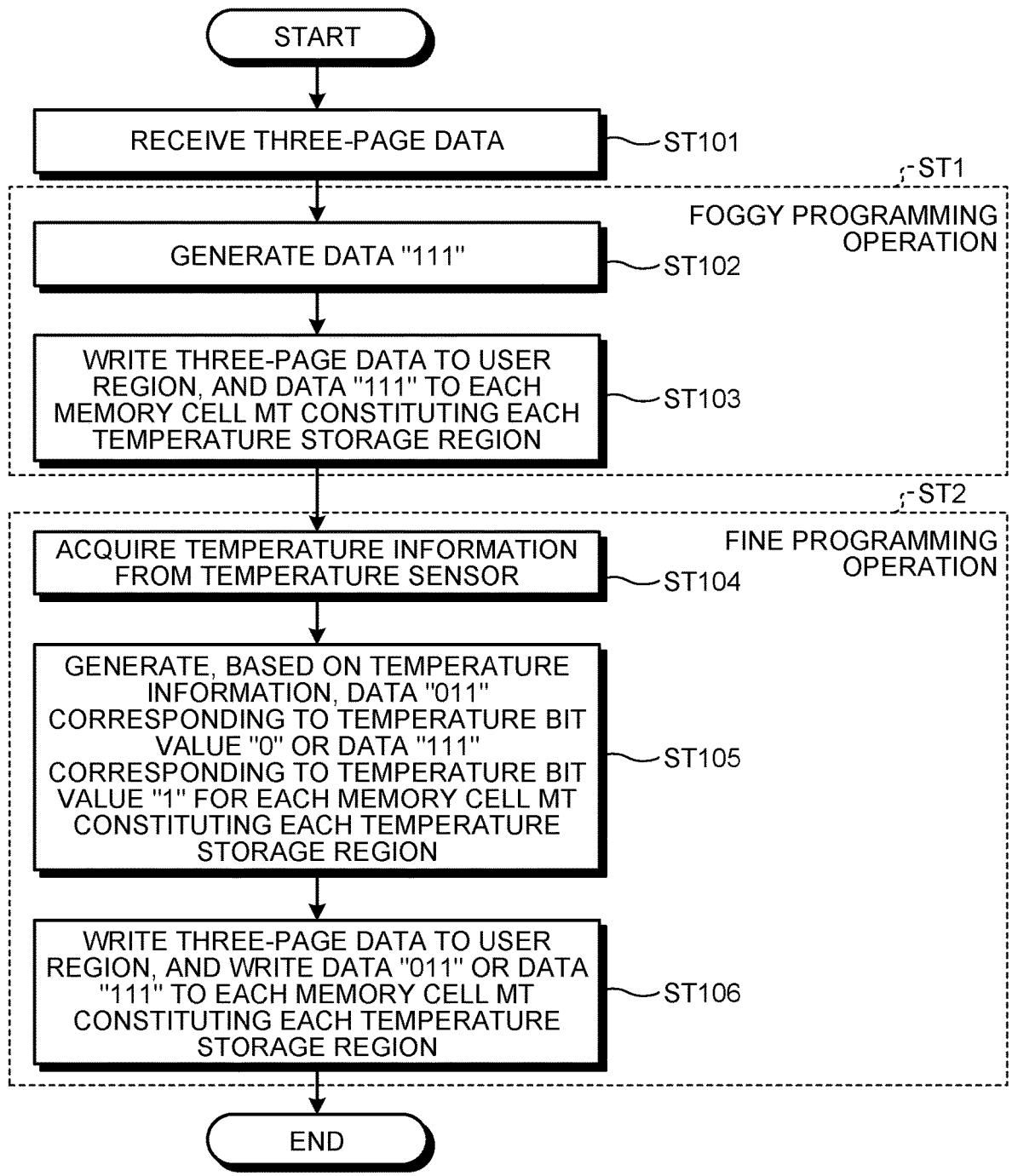
FIG. 10 is a flowchart illustrating an exemplary programming operation of a memory chip according to the first embodiment.

FIG. 10 is a flowchart illustrating an exemplary programming operation of the memory chip 10 in the first embodiment.

The I/O interface 13 receives three-page data together with a write command from the memory controller 2 (ST101). The three-page data received from the memory controller 2 includes data for a lower page, a middle page, and an upper page. The three-page data is user data to which ECC parity bits are added. The control circuitry 15 (more specifically, the column module 18 in the control circuitry 15) executes a foggy programming operation in response to reception of the three-page data (ST1).

In the foggy programming operation, the sequencer 16 generates data "111" to be written to the individual memory cells MT constituting the temperature storage region ARtemp (ST102). The control circuitry 15 then applies a programming pulse to the word line WL connected to the memory cell group MCG as a write destination once or more so as to write the three-page data to the user region ARusr. Specifically, the control circuitry 15 writes the data "111" to each of the memory cells MT constituting the temperature storage region ARtemp (ST103). This completes the foggy programming operation.

Subsequently, the control circuitry 15 executes a fine programming operation (ST2).

In the fine programming operation, the sequencer 16 acquires temperature information TEMP from the temperature sensor 12 (ST104). Based on the temperature information TEMP, the sequencer 16 generates data "011" corresponding to the temperature bit value TEMP-b of 0 or data "111" corresponding to the temperature bit value TEMP-b of 1 for each of the memory cells MT in the temperature storage region ARtemp (ST105).

The control circuitry 15 applies a programming pulse to the word line WL connected to the memory cell group MCG as a write destination once or more so as to write the three-page data to the user region ARusr. Specifically, the control circuitry 15 writes the data "011" or "111" generated in ST105 to each of the memory cells MT in the temperature storage region ARtemp (ST106). This completes the fine programming operation and the memory chip 10 completes the programming operation.

In this manner, the memory chip 10 autonomously acquires the temperature information TEMP and writes the temperature information TEMP to the temperature storage region ARtemp in the programming operation for writing the user data received from the memory controller 2 to the memory cell group MCG.

The memory chip 10 can output the temperature information TEMP from the temperature storage region ARtemp in response to a read command from the memory controller 2.

The memory controller 2 uses a read command including a sense command and a data-out command to cause the memory chip 10 to execute a read operation. The sense command is a command for instructing the memory chip 10 to transfer data from a read-target memory cell group MCG to the data buffer 14 via the data latch. The data-out command is a command for instructing the memory chip 10 to output part or all of the stored data from the data buffer 14 to the memory controller 2 in response to a sense command. The data-out command can be used once or more after the sense command.

The data-out command includes a column address serving as information for designating data to be output among the data stored in the data buffer 14. To acquire the temperature information TEMP from the memory chip 10, the memory controller 2 designates a column address, that is, an address indicating a column including the temperature storage region ARtemp.

The memory cells MT constituting the temperature storage region ARtemp each store 3-bit written data corresponding to the temperature bit value TEMP-b. Thus, the memory controller 2 acquires 3-bit data from each of the memory cells MT in the temperature storage region ARtemp. That is, the memory controller 2 acquires eight 3-bit data sets per one temperature storage region ARtemp.

The memory controller 2 acquires four data sets from the four temperature storage regions ARtemp, to acquire the temperature information TEMP based on the four data sets.

Figure 11:
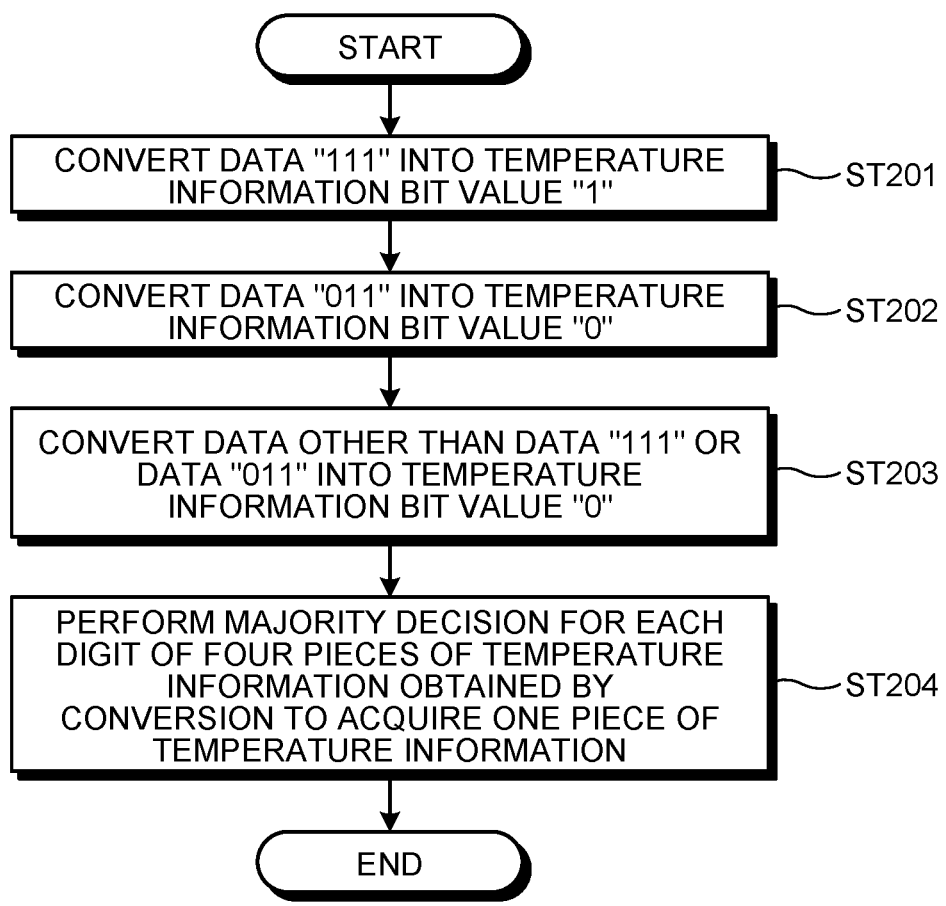
FIG. 11 is a flowchart illustrating an exemplary operation of acquiring the temperature information TEMP from four data sets performed by a memory controller according to the first embodiment.

FIG. 11 is a flowchart illustrating an exemplary operation of the memory controller 2 to acquire the temperature information TEMP from four data sets in the first embodiment.

The memory controller 2 converts data "111" included in the four data sets into the corresponding temperature bit value TEMP-b of 1 (ST201). Similarly, the memory controller 2 converts data "011" included in the four data sets into the corresponding temperature bit value TEMP-b of 0 (ST202).

As described above, the threshold voltages of the memory cells MT may fluctuate due to various factors. The temperature information TEMP is written to the temperature storage region ARtemp without undergoing error correction coding. This may result in reading 3-bit data different from the written 3-bit data from the memory cells MT in the temperature storage region ARtemp.

In some case, for example, the threshold voltage may fluctuate from the state S0 to the state S1 or from the state S1 to the state S0. Due to the threshold voltage fluctuation in such a pattern, the four data sets may include data that has been written as "111" but read as "011" or data that has been written as data "011" but read as "111". Such incorrectly acquired data due to a threshold voltage fluctuation between the state S0 and the state S1 is corrected by a majority decision process (ST204) to be described below.

In another case, the four data sets may include, for example, neither data "111" nor data "011", i.e., data corresponding to any of the states S2 to S7. According to the distance between the states before and after the fluctuation, fluctuation is more likely to occur from the state S1 to any of the states S2 to S7 than from the state S0 to any of the states S2 to S7. Thus, of the four data sets, data corresponding to one of the states S2 to S7, if any, is highly likely to have been written as "011" corresponding to the state S1. In view of this, the memory controller 2 regards data, of the four data sets, corresponding to any of the states S2 to S7, as data having changed from the data "011". The memory controller 2 converts data, of the four data sets, other than the data "111" and the data "011" into the temperature bit value TEMP-b of 0 (ST203).

Through ST201 to ST203, 3-bit data corresponding to the state S0 is converted into the temperature bit value TEMP-b of 1 while 3-bit data corresponding to any of the states S1 to S7 is converted into the temperature bit value TEMP-b of 0. As such, the memory controller 2 acquires the temperature information TEMP from each of the four data sets. However, the temperature information TEMP may include error arising from the fluctuation between the state S0 and the state S1. Thus, the memory controller 2 performs a majority decision with respect to each digit of the four pieces of temperature information TEMP obtained by the conversion to determine one piece of temperature information TEMP (ST204).

Specifically, the memory controller 2 performs a majority decision to the head to i-$^{th}$ bit values (where i is an integer from 1 to 8) of the four pieces of temperature information TEMP to determine the i-$^{th}$ bit value. The memory controller 2 determines one piece of temperature information TEMP by performing a majority decision for each digit of the 8-bit string as described above.

ST204 completes the operation of acquiring the temperature information TEMP.

In the example illustrated in FIG. 11, the memory controller 2 acquires 3-bit data per memory cell MT from the memory chip 10, to acquire the temperature information TEMP based on the 3-bit data. The method of acquiring the temperature information TEMP is not limited to this method.

For example, the memory chip 10 may be configured to be able to perform, in the SLC mode, a read operation to the memory cells MT having multiple-bit data written thereto. In the read operation in the SLC mode, the memory chip 10 outputs "1" or "0" depending on whether the threshold voltage of each memory cell MT is higher or lower than one detection voltage Vsense designated by the memory controller 2. The memory controller 2 can acquire the temperature information TEMP from each of the four temperature storage regions ARtemp by the read operation in the SLC mode.

In the read operation in the SLC mode, for example, the memory chip 10 outputs "1" when the threshold voltage of the memory cell MT is lower than the detection voltage Vsense, and outputs "0" when the threshold voltage of the memory cell MT is higher than the detection voltage Vsense. With respect to the memory chip 10 configured as above, the memory controller 2 sets the voltage Va1 (refer to FIG. 8) as the detection voltage Vsense and instructs the memory chip 10 to perform a read operation in the SLC mode. Thereby, the memory controller 2 acquires "1" from the memory cells MT in the state S0 and acquires "0" from the memory cells MT in the states S1 to S7. Thus, the memory controller 2 can directly acquire the temperature information TEMP written according to the correspondence illustrated in FIG. 9 from each temperature storage region ARtemp. In other words, the memory controller 2 can acquire the temperature information TEMP written according to the correspondence illustrated in FIG. 9 from each temperature storage region ARtemp without referring to the data coding. After acquiring the temperature information TEMP from each temperature storage region ARtemp, the memory controller 2 executes the majority decision in ST204 of FIG. 11 to acquire the temperature information TEMP having removed error caused by the fluctuation between the state S0 and the state S1.

As such, while the memory cell MT is set in the state S0 or the state S1 in accordance with the temperature bit value TEMP-b, the memory controller 2 can acquire the temperature information TEMP by any method as long as it can determine the state of the memory cell MT, i.e., the state S0 or any of the states S1 to S7.

The first embodiment has described the example that the temperature information TEMP is multiplexed into four pieces. The number of pieces of temperature information TEMP after multiplexing is not limited to four. For example, the memory chip 10 may be configured to multiplex the temperature information TEMP into an odd number of pieces to allow the memory controller 2 to determine one piece of temperature information TEMP without fail by a majority decision for each digit of the multiplexed temperature information TEMP.

According to the first embodiment, in the foggy programming operation being the first-stage programming operation, the control circuitry 15 sets the threshold voltage of each of the memory cells MT constituting the user region ARusr of the memory cell group MCG, in one section RX' of the sections R0' to R7' corresponding to write data. Further, in the foggy programming operation the control circuitry 15 sets the threshold voltage of each of the of memory cells MT constituting the temperature storage region ARtemp of the memory cell group MCG, in the section R0' among the sections R0' to R7'. In the fine programming operation being the second-stage programming operation, the control circuitry 15 sets the threshold voltage of each of the memory cells MT constituting the user region ARusr in one section RX of the sections R0 to R7 corresponding to write data. Further, in the fine programming operation the control circuitry 15 sets the threshold voltage of each of the memory cells MT constituting the temperature storage region ARtemp in one (RX) of the section R0 and the section R1 corresponding to the temperature information TEMP.

This enables recording of temperatures in units of data writing, i.e., units of the memory cell group MCG, in place of units larger than the units of data writing. Specifically, the memory chip 10 can properly record temperatures in the write operation.

The first embodiment can be variously modified. Some modifications of the first embodiment will be described below.

First Modification of First Embodiment

The first embodiment has described the example of setting the threshold voltages of the memory cells MT in the state S0 or the state S1 in accordance with the temperature bit value TEMP-b in the fine programming operation. The two states of the threshold voltages of the memory cells MT to be set in accordance with the temperature bit value TEMP-b are not limited to the state S0 and the state S1.

The designer can freely determine the two states of the threshold voltages of the memory cells MT in accordance with the temperature bit value TEMP-b as long as the threshold voltages of the memory cells MT are in a state the same as or on the higher voltage side than the state after the foggy programming operation. In order to reduce the inter-cell interference and the time required to complete the fine programming operation as much as possible, however, it is desirable that the amount of shift that the threshold voltages of the memory cells MT exhibit by the fine programming operation be small.

Figure 12:
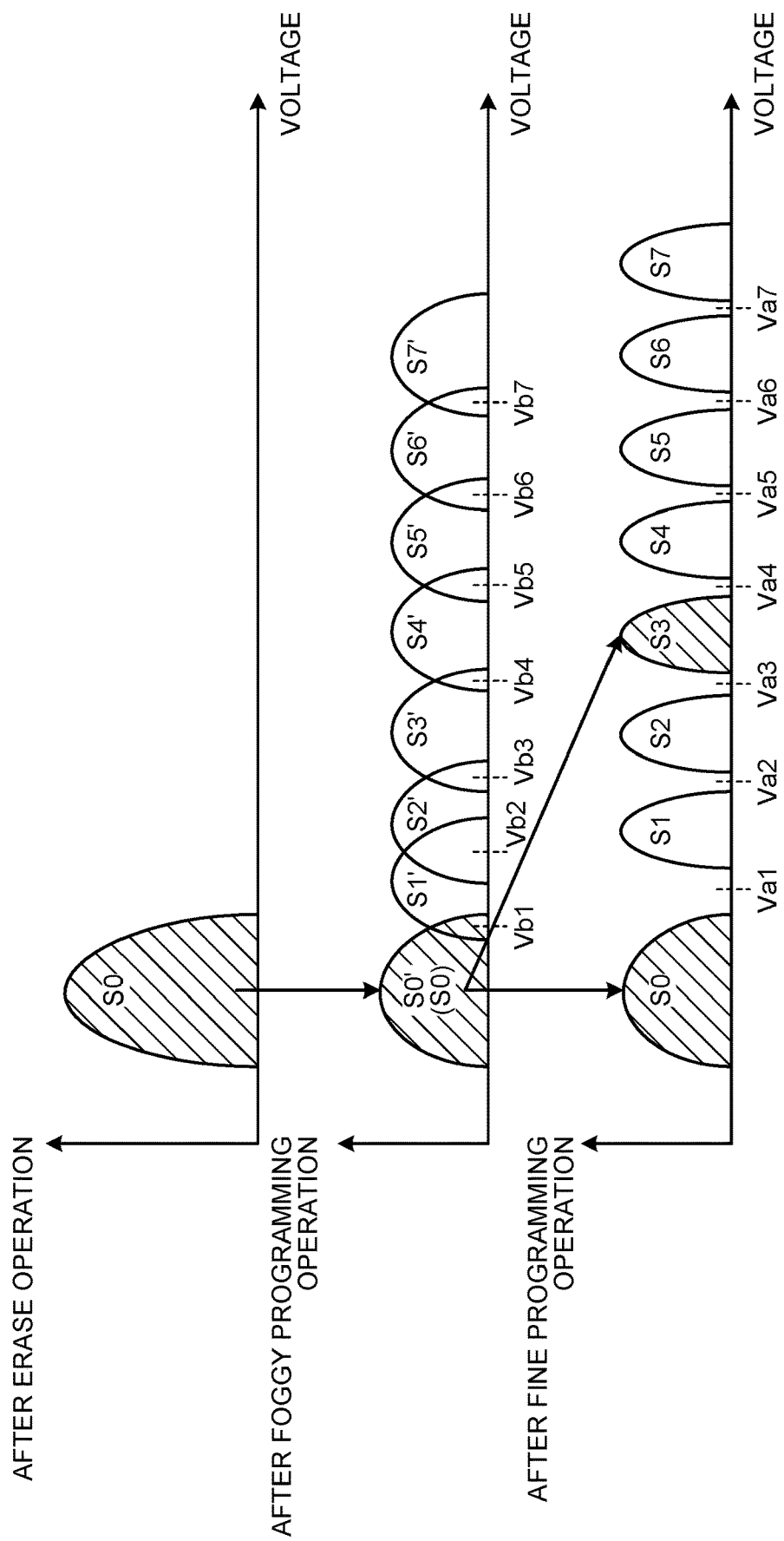
FIG. 12 is a schematic diagram illustrating an example of shift in the threshold voltage of the memory cells MT constituting the temperature storage region ARtemp according to a first modification of the first embodiment.

In a first modification of the first embodiment, as illustrated in FIG. 12, in the fine programming operation the threshold voltages of the memory cells MT constituting the temperature storage region ARtemp are set in the state S0 or the state S3 in accordance with the temperature bit value TEMP-b.

In the example illustrated in FIG. 12, the threshold voltages of the memory cells MT shift in amount from the state S0' (i.e., state S0) to the state S3 at a maximum, and is sufficiently smaller than the range R10 including the section R0 to the section R7. This makes it possible to reduce inter-cell interference with respect to the temperature storage region ARtemp and reduce the time required for completion of the fine programming operation.

FIG. 13 is a diagram illustrating 3-bit data to be generated in a programming operation to the temperature storage region ARtemp in the first modification of the first embodiment. Referring to FIG. 13, the memory cells MT constituting the temperature storage region ARtemp are simply referred to as memory cells MT unless otherwise specified.

In the foggy programming operation as in the first embodiment, the sequencer 16 generates data "111" regardless of whether the temperature bit value TEMP-b is 0 or 1 to supply the data "111" to the column module 18. Specifically, values "1", "1", and "1" are written to the lower bit, the middle bit, and the upper bit of the memory cell MT, respectively. Thus, the threshold voltage of the memory cell MT is set in the state S0' (S0) regardless of whether the temperature bit value TEMP-b retained in the memory cell MT is 0 or 1.

In the fine programming operation, the sequencer 16 generates data "000" and supplies the data "000" to the column module 18 when the temperature bit value TEMP-b is zero. Specifically, values "0", "0", and "0" are written to the lower bit, the middle bit, and the upper bit of the memory cell MT, respectively. Thus, the threshold voltage of the memory cell MT is set in the state S3. In response to the temperature bit value TEMP-b of 1, the sequencer 16 generates data "111" and supplies the data "111" to the column module 18. Specifically, values "1", "1", and "1" are written to the lower bit, the middle bit, and the upper bit of the memory cell MT, respectively. Thus, the threshold voltage of the memory cell MT is set in the state S0.

To acquire the temperature information TEMP, the memory controller 2 may read 3-bit data from each memory cell MT or may instruct the memory chip 10 to perform a read operation in the SLC mode, as in the first embodiment. In the first modification of the first embodiment, however, the memory controller 2 acquires the temperature bit value TEMP-b of 1 corresponding to the state S0 from the memory cells MT being in the states S0 and S1 and the temperature bit value TEMP-b of 0 corresponding to the state S3 from the memory cells MT being in the states S2 to S7.

The memory controller 2 configured to read 3-bit data per memory cell MT converts 3-bit data as follows. The memory controller 2 converts not only the data "111" corresponding to the state S0 but also the data "011" corresponding to the state S1 into the temperature bit value TEMP-b of 1. The memory controller 2 converts not only the data "000" corresponding to the state S3 but also the data "001" corresponding to the state S2, the data "010" corresponding to the state S4, the data "110" corresponding to the state S5, the data "100" corresponding to the state S6, and the data "101" corresponding to the state S7 into the temperature bit value TEMP-b of 0.

The memory controller 2 configured to acquire the temperature information TEMP by the read operation in the SLC mode sets the voltage Va2 (refer to FIG. 12) as the detection voltage Vsense and instructs the memory chip 10 to perform a read operation in the SLC mode. Thereby, the memory controller 2 acquires "1" from the memory cells MT with threshold voltages being in the states S0 to S1 and "0" from the memory cells MT with threshold voltages being in the states S2 to S7. Thus, the memory controller 2 can directly acquire the temperature information TEMP, which has been written according to the correspondence illustrated in FIG. 13, from each of the temperature storage regions ARtemp. In other words, the memory controller 2 can acquire the temperature information TEMP written according to the correspondence illustrated in FIG. 13 from each of the temperature storage regions ARtemp without referring to the data coding.

In the first modification of the first embodiment, the two states S0 and S3 corresponding to the temperature bit values TEMP-b are apart from each other across the two states S1 and S2. In reading the temperature information TEMP, the memory controller 2 determines the temperature bit value TEMP-b depending on whether the threshold voltage of the memory cell MT is higher or lower than the intermediate voltage between the two states S0 and S3 (voltage Va1 in this example). In some situation the state S0 or the state S3 of the memory cell MT according to the temperature bit value TEMP-b may shift to an adjacent state. Even in such a case the memory controller 2 can acquire the temperature bit value TEMP-b without error. In other word, it is possible to avoid occurrence of error at the time of reading the temperature information TEMP.

In the first modification of the first embodiment, the two states to be set according to the temperature bit value TEMP-b are apart from each other across two other states. The correspondence between the temperature bit values TEMP-b and the states may be set such that two states to be set according to the temperature bit value TEMP-b are apart from each other across one state or three or more states. As described above, the designer can freely select two states to be set in the fine programming operation as long as the threshold voltages of the memory cells MT are in a state or on the higher voltage side than the state in the foggy programming operation.

Second Modification of First Embodiment

The state S0 corresponds to an erased state and has a characteristic different from the states S1 to S7. Specifically, the distributions of the memory cells MT having the threshold voltages set in the state S0 may spread in a wider range than in the states S1 to S7. Thus, the amount of shift in the threshold voltage from the state S0 to the adjacent state S1 is larger than that from other states to their adjacent states.

In a second modification of the first embodiment, the threshold voltages of the memory cells MT are set in a state SX' located second or subsequent from the low voltage side among the states S0' to S7' in the foggy programming operation. This makes it possible to minimize the amount of shift in the threshold voltages of the memory cells MT constituting the temperature storage region ARtemp in the fine programming operation.

Figure 14:
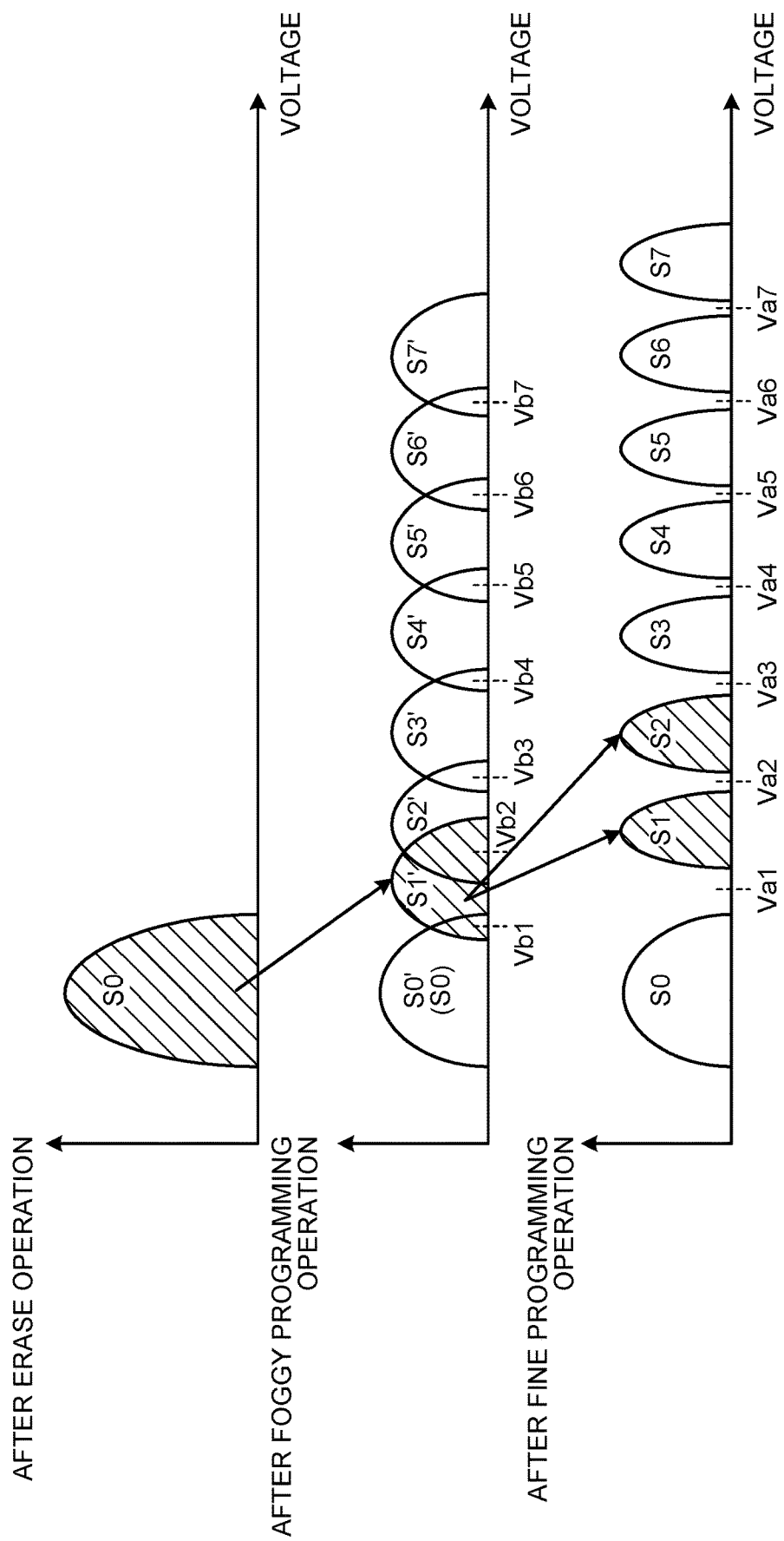
FIG. 14 is a schematic diagram illustrating an example of shift in the threshold voltage of the memory cells MT constituting the temperature storage region ARtemp according to a second modification of the first embodiment.

For example, as illustrated in FIG. 14, the threshold voltages of the memory cells MT constituting the temperature storage region ARtemp are set in the state S1' in the foggy programming operation. In the subsequent fine programming operation, the threshold voltages of the memory cells MT are set in the state S1 or the state S2 in accordance with the temperature bit value TEMP-b.

FIG. 15 is a diagram illustrating 3-bit data to be generated in a programming operation to the temperature storage region ARtemp according to the second modification of the first embodiment. Referring to FIG. 15, the memory cells MT constituting the temperature storage region ARtemp are simply referred to as memory cells MT unless otherwise specified.

In the foggy programming operation the sequencer 16 generates data "011" regardless of whether the temperature bit value TEMP-b is 0 or 1, and supplies the data "011" to the column module 18. Specifically, values "0", "0", and "1" are written to the lower bit, the middle bit, and the upper bit of the memory cell MT, respectively. Thus, the threshold voltages of the memory cells MT are set in the state S1' regardless of whether the temperature bit value TEMP-b retained in each memory cell MT is 0 or 1.

In the fine programming operation, in response to the temperature bit value TEMP-b of 0, the sequencer 16 generates data "001" and supplies the data "001" to the column module 18. Specifically, values "0", "0", and "1" are written to the lower bit, the middle bit, and the upper bit of the memory cell MT, respectively. The threshold voltages of the memory cells MT are set in the state S2. In response to the temperature bit value TEMP-b of 1, the sequencer 16 generates data "011" and supplies the data "011" to the column module 18. Specifically, values "0", "1", and "1" are written to the lower bit, the middle bit, and the upper bit of the memory cell MT, respectively. The threshold voltages of the memory cells MT are thus set in the state S1.

To acquire the temperature information TEMP, the memory controller 2 may read 3-bit data from each memory cell MT or may instruct the memory chip 10 to perform a read operation in the SLC mode, as in the first embodiment. In the second modification of the first embodiment, however, the memory controller 2 acquires the temperature bit value TEMP-b of 1 corresponding to the state S1 from the memory cells MT having the threshold voltages being in the states S0 to S1. The memory controller 2 also acquires the temperature bit value TEMP-b of 0 corresponding to the state S2 from the memory cells MT having the threshold voltages being in the states S2 to S7.

In the above example, the threshold voltages of the memory cells MT are set in the state S1' in the foggy programming operation. The state of the threshold voltages of the memory cells MT in the foggy programming operation is not limited to the state S1'. The designer can freely select the threshold voltage of each memory cell MT in the foggy programming operation from among the states S2' to S6'.

In the above example, in the fine programming operation the threshold voltages of the memory cells MT are set in the state S1 or the state S2 in accordance with the temperature bit value TEMP-b. The two states of the threshold voltages of the memory cells MT to be set in accordance with the temperature bit value TEMP-b in the fine programming operation are not limited to the state S1 and the state S2. In the fine programming operation, the memory cells MT may be set in any two states as long as the threshold voltages of the memory cells MT are in a state same as or on the higher voltage side than the state in the foggy-fine programming operation. For example, as described in the first modification of the first embodiment, two states of the threshold voltages to be set in the fine programming operation may be apart from each other across one or more states.

In the first embodiment and first modification the control circuitry 15 acquires the temperature information TEMP from the temperature sensor 12 in the fine programming operation.

This makes it possible to record temperatures at an instance approximate to the time at which writing data of all the pages to the memory cell group MCG is complete.

The timing at which the temperature information TEMP is acquired is not limited to that during the fine programming operation. As an example, the control circuitry 15 may acquire the temperature information TEMP in the foggy programming operation and write the temperature information TEMP to the temperature storage region ARtemp in the fine programming operation.

Second Embodiment

The first embodiment and first and second modifications have described the example of setting, in the foggy programming operation, the threshold voltages of the memory cells MT constituting the temperature storage region ARtemp in the same state regardless of whether the temperature bit values TEMP-b retained in the memory cells MT are 0 or 1. In the foggy programming operation, the threshold voltages of the memory cells MT may be set in one of two states in accordance with the temperature bit value TEMP-b.

Figure 16:
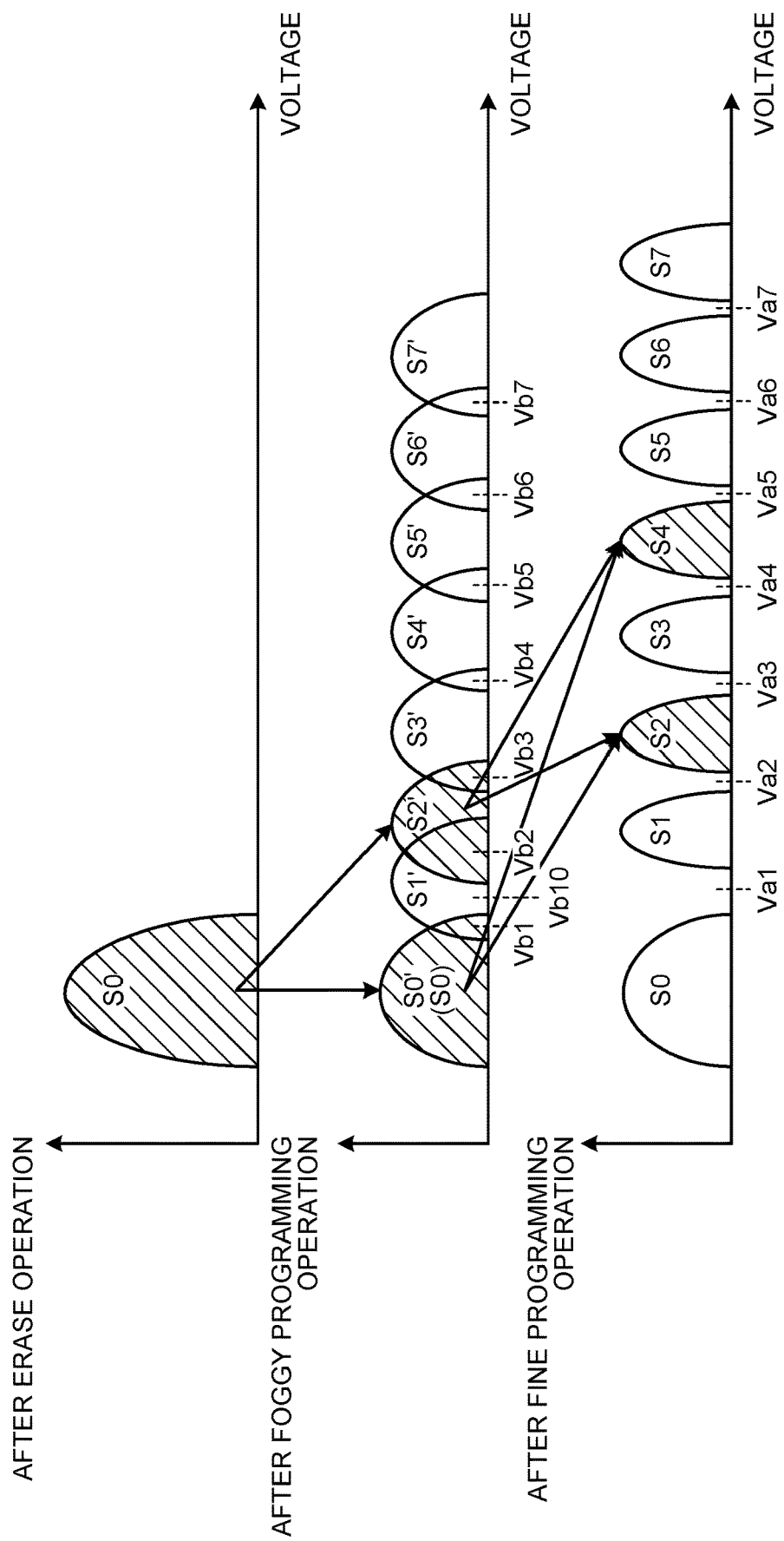
FIG. 16 is a schematic diagram illustrating an example of shift in the threshold voltage of the memory cells MT constituting a temperature storage region ARtemp according to a second embodiment.

For example, as illustrated in FIG. 16, in the foggy programming operation the threshold voltages of the memory cells MT constituting the temperature storage region ARtemp are set in the state S0' (S0) or the state S2' in accordance with the temperature bit value TEMP-b.

In the subsequent fine programming operation, the threshold voltages of the memory cells MT constituting the temperature storage region ARtemp are set in the state S2 or the state S4 in accordance with the temperature bit value TEMP-b.

The state S2 and the state S4 are located on the higher voltage side than the state S2' which is higher in voltage between the two states set in the foggy programming. In the fine programming operation, thus, the threshold voltages of the memory cells MT can be set in either the state S2 or the state S4 regardless of the state after the foggy programming operation. Because of this, in the foggy programming operation and the fine programming operation the temperature information TEMP of different values may be written. The memory chip 10 acquires the temperature information TEMP from the temperature sensor 12 and writes the temperature information TEMP in both of the foggy programming operation and the fine programming operation.

FIG. 17 is a diagram illustrating 3-bit data to be generated in a programming operation to the temperature storage region ARtemp in the second embodiment. Referring to FIG. 17, the memory cells MT constituting the temperature storage region ARtemp are simply referred to as memory cells MT unless otherwise specified.

In the foggy programming operation, in response to the temperature bit value TEMP-b of 0, the sequencer 16 generates data "001" and supplies the data "001" to the column module 18. Specifically, values "0", "0", and "1" are written to the lower bit, the middle bit, and the upper bit of the memory cell MT, respectively. In this manner, the threshold voltage of the memory cell MT is set in the state S2'. In response to the temperature bit value TEMP-b of 1, the sequencer 16 generates data "111" and supplies the data "111" to the column module 18. Specifically, values "1", "1", and "1" are written to the lower bit, the middle bit, and the upper bit of the memory cell MT, respectively. In this manner, the threshold voltage of the memory cell MT is set in the state S0' (S0).

In the fine programming operation, in response to the temperature bit value TEMP-b of 0, the sequencer 16 generates data "001" and supplies the data "001" to the column module 18. Specifically, values "0", "0", and "1" are written to the lower bit, the middle bit, and the upper bit of the memory cell MT, respectively. In this manner, the threshold voltage of the memory cell MT is set in the state S2. In response to the temperature bit value TEMP-b of 1, the sequencer 16 generates data "010" and supplies the data "010" to the column module 18. Specifically, values "0", "1", and "0" are written to the lower bit, the middle bit, and the upper bit of the memory cell MT, respectively. In this manner, the threshold voltage of the memory cell MT is set in the state S4.

Figure 18:
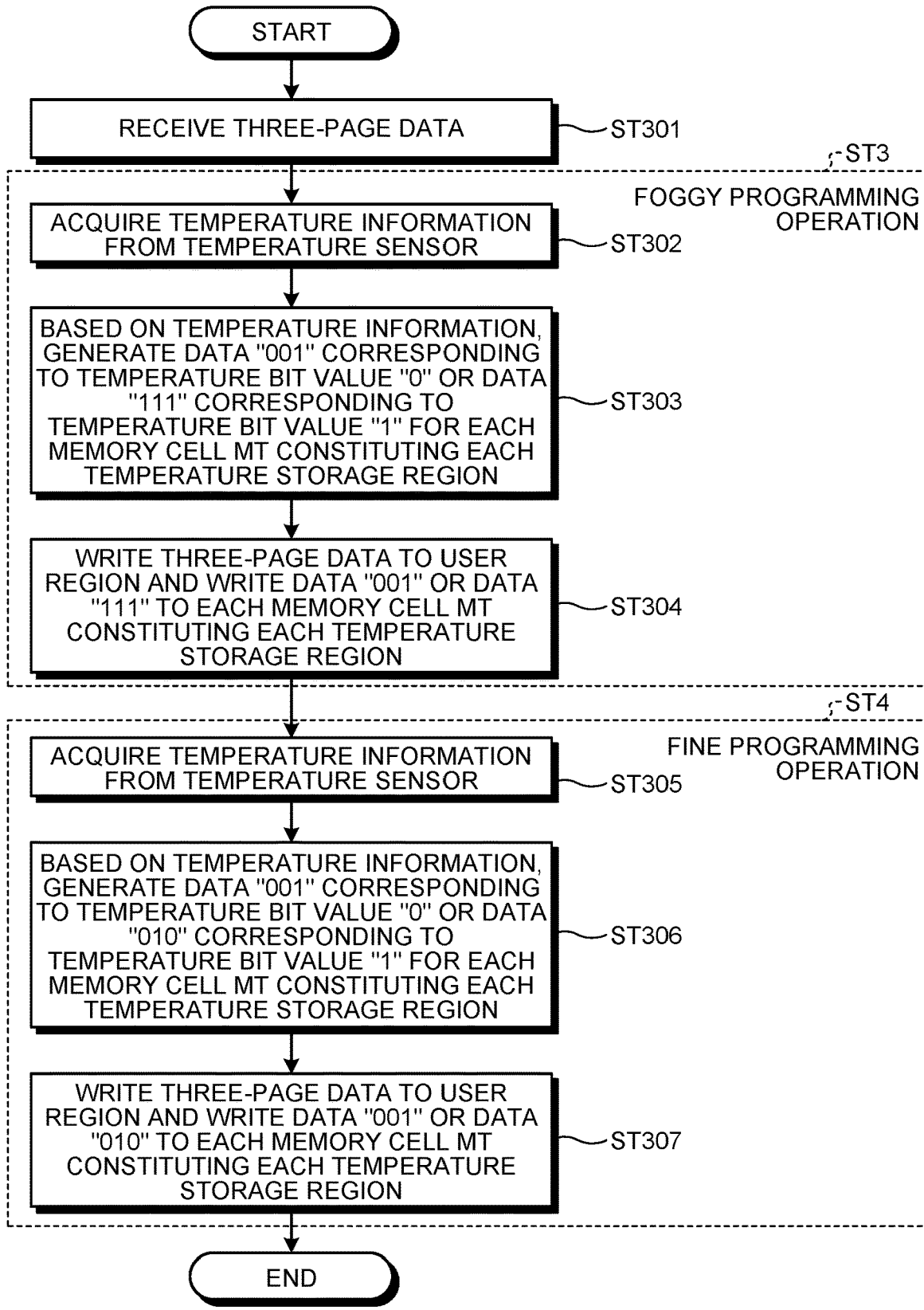
FIG. 18 is a flowchart illustrating an exemplary programming operation of a memory chip according to the second embodiment.

FIG. 18 is a flowchart illustrating an exemplary programming operation of the memory chip 10 according to the second embodiment.

The I/O interface 13 receives three-page data together with a write command from the memory controller 2 (ST301), and the control circuitry 15 executes a foggy programming operation (ST3).

In the foggy programming operation, the sequencer 16 acquires temperature information TEMP from the temperature sensor 12 (ST302). Based on the temperature information TEMP acquired in ST302, the sequencer 16 generates data "001" corresponding to the temperature bit value TEMP-b of 0 or data "111" corresponding to the temperature bit value TEMP-b of 1 for the individual memory cells MT constituting the temperature storage region ARtemp (ST303).

The control circuitry 15 applies a programming pulse to the word line WL connected to the memory cell group MCG as a write destination once or more so as to write three-page data to the user region ARusr.

Specifically, the control circuitry 15 writes the data "001" or the data "111" generated in ST303 to each of the memory cells MT constituting the temperature storage region ARtemp (ST304). This ends the foggy programming operation.

The control circuitry 15 executes a fine programming operation after the foggy programming operation (ST4).

In the fine programming operation, the sequencer 16 acquires temperature information TEMP from the temperature sensor 12 (ST305). Based on the temperature information TEMP acquired in ST305, the sequencer 16 generates data "001" corresponding to the temperature bit value TEMP-b of 0 or data "010" corresponding to the temperature bit value TEMP-b of 1 for the individual memory cells MT constituting each temperature storage region ARtemp (ST306).

By applying one or more programming pulses to the word line WL connected to the memory cell group MCG as a write destination, the control circuitry 15 writes the three-page data received in ST301 to the user region ARusr, and writes the data "001" or data "010" generated in ST306 to the individual memory cells MT constituting each temperature storage region ARtemp (ST307). This completes the fine programming operation and the memory chip 10 completes the programming operation.

The memory controller 2 can acquire the temperature information TEMP written by the fine programming operation by a method similar to the method described in the first embodiment or its modifications.

In addition, the memory controller 2 can acquire the temperature information TEMP written by the foggy programming operation until the fine programming operation starts. Specifically, the memory controller 2 designates a voltage (for example, voltage Vb10 in FIG. 16) between the state S0' and the state S2' as the detection voltage Vsense, and instructs the memory chip 10 to perform a read operation in the SLC mode. Thereby, the memory controller 2 can acquire the temperature bit value TEMP-b of 1 corresponding to the state S0' (S0) from the memory cells MT whose threshold voltages are on the lower voltage side than the voltage Vb10. The memory controller 2 can also acquire the temperature bit value TEMP-b of 0 corresponding to the state S2' from the memory cells MT whose threshold voltages are on the higher voltage side than the voltage Vb10.

The memory controller 2 acquires four pieces of temperature information TEMP written by the foggy programming operation or by the fine programming operation from the four temperature storage regions ARtemp. Subsequently, the memory controller 2 executes a majority decision (e.g., as in ST204 in FIG. 11) to the four pieces of temperature information TEMP, to be able to determine one piece of temperature information TEMP.

According to the second embodiment as described above, the control circuitry 15 acquires the temperature information TEMP from the temperature sensor 12 in the foggy programming operation being the first-stage programming operation. The control circuitry 15 then sets the threshold voltages of the individual memory cells MT constituting the user region ARusr in a state corresponding to write data, namely, one of the states S0' to S7'. Furthermore, the control circuitry 15 sets the threshold voltages of the individual memory cells MT constituting the temperature storage region ARtemp in a state corresponding to the temperature information TEMP acquired in the foggy programming operation, namely, one of the two states S0' and S2'.

In addition, the control circuitry 15 acquires the temperature information TEMP from the temperature sensor 12 in the fine programming operation being the second-stage programming operation. The control circuitry 15 then sets the threshold voltages of the individual memory cells MT constituting the user region ARusr in a state corresponding to the write data, namely, one of the states S0 to S7. Furthermore, the control circuitry 15 sets the threshold voltages of the individual memory cells MT constituting the temperature storage region ARtemp in a state corresponding to the temperature information TEMP acquired in the fine programming operation, namely, one of the two states S2 and S4.

As such, the memory chip 10 can record the temperature information TEMP related to the foggy programming operation. The memory controller 2 can acquire the temperature information TEMP related to the foggy-fine programming operation from the memory chip 10 until the fine programming operation starts.

Thus, if a failure occurs in the memory chip 10 in a period from the end of the foggy programming operation to the start of the fine programming operation, for example, the memory controller 2 can acquire the temperature information TEMP related to the foggy programming operation as the temperature information at the time of the failure.

In the foggy programming operation of the second embodiment, the threshold voltages of the memory cells MT are set in the state S0' or S2' in accordance with the temperature bit value TEMP-b. In the fine programming operation, the threshold voltages of the memory cells MT are set in the state S2 or S4 in accordance with the temperature bit value TEMP-b. Two states of the threshold voltages of the memory cells MT to be set according to the temperature bit value TEMP-b in the foggy programming operation and the fine programming operation are not limited to these examples.

The designer can freely select two states to be set in the foggy programming operation and in the fine programming operation, respectively, as long as the lower-voltage state of the two states to be set in the fine programming operation is the same as or located on a higher voltage side than the higher-voltage state of the two states to be set in the foggy programming operation.

For example, the two states to be set in the fine programming operation may be adjacent states or apart from each other across one or more states.

The two states to be set in the foggy programming operation may be selected from among the states S1' to S6'.

Third Embodiment

Multi-stage programming using internal data loading is known in addition to the foggy-fine programming. A third embodiment will describe a memory chip 10 capable of performing multi-stage programming using internal data loading. A multi-stage programming operation using internal data loading (IDL) is referred to as an IDL programming operation.

In a first-stage programming operation of the IDL programming operation, the memory chip 10 writes, to the memory cell MT, partial bit data of multiple-bit data to be finally written thereto. The number of bits of data to be finally written to the memory cell MT is defined as (P+Q) bits while the number of bits of data to be written to the memory cell MT in the first-stage programming operation is defined as P bits. P and Q both represent integers of 1 or more. Specifically, in the first-stage programming operation the threshold voltage of each memory cell MT is set in any of $2^P$ sections associated with P-bit data.

In a second-stage programming operation of the IDL programming operation, the memory chip 10 reads P-bit written data from the memory cell MT. P-bit read data and Q-bit data received from the memory controller 2 are combined to (P+Q) bit data which is written to the memory cell MT. The threshold voltage of each of the memory cells MT is set in one of $2^{(P+Q)}$ sections associated with the (P+Q) bit data. The memory chip 10's reading P-bit written data from the memory cell MT is referred to as internal data loading.

The memory chip 10 selects memory cells MT to be a target of the first and second-stage programming operations by a method similar to that in the foggy-fine programming operation, for example. Specifically, the memory chip 10 executes the first-stage programming operation to a first memory cell MT and a second memory cell MT adjacent to the first memory cell MT, and then executes the second-stage programming operation to the first memory cell MT. This results in reducing inter-cell interference.

Figure 19:
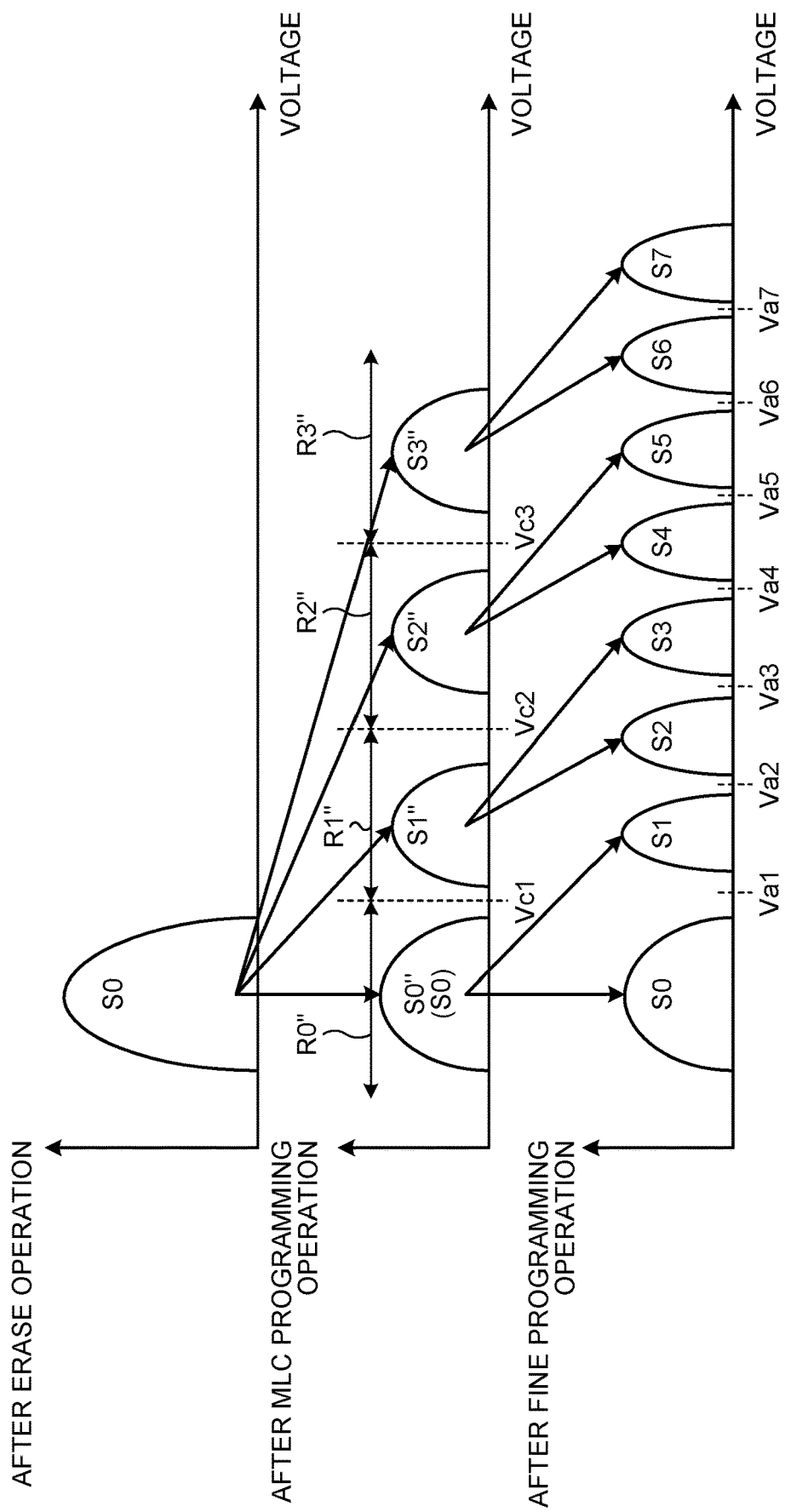
FIG. 19 is a schematic diagram illustrating variation in threshold voltage distribution due to IDL programming operation executed by a memory chip of a third embodiment.

FIG. 19 is a schematic diagram illustrating variation in threshold voltage distribution due to an IDL programming operation of the memory chip 10 according to the third embodiment. Referring to FIG. 19, as an example, among 3-bit data to be written in the TLC mode, 2-bit data is to be written in the first-stage programming operation. Specifically, P is defined as 2 and Q is defined as 1. The first-stage programming operation is referred to as an MLC programming operation since 2-bit data is written per memory cell MT. The second-stage programming operation is referred to as a fine programming operation.

After the erase operation, all the memory cells MT in the block 30 are in the state S0, as illustrated in the uppermost graph of FIG. 19.

The memory cell group MCG in the erased state undergoes an MLC programming operation being the first-stage programming operation.

In the MLC programming operation the threshold voltage of each memory cell MT is set so as to be included in any of four sections R0" to R3" associated with 2-bit data. A section R0" is located on the lower voltage side than voltage Vc1 where Vc1≤Va1. A section R1" ranges from voltage Vc1 to voltage Vc2 where Vc2 Va3. A section R2" ranges from voltage Vc2 to voltage Vc3 where Vc3 Va5. A section R3" is located on the higher voltage side than voltage Vc3. Hereinafter, a section RX" may be referred to as a state SX".

By the MLC programming operation, the groups of memory cells MT having the threshold voltages in any of the states S0" to S3" form lobe-form distributions.

The memory chip 10 performs the MLC programming operation to the groups of memory cells MT such that the distributions are not to protrude to adjacent states as much as possible. Specifically, the MLC programming operation results in four separate distributions S0" to S3".

In internal data loading, the memory chip 10 performs a read operation to the memory cells MT having the MLC programming operation completed, using the voltages Vc1, Vc2, and Vc3 as the detection voltage Vsense, for example. The threshold voltages are set so as not to protrude to adjacent states in the distributions as much as possible. Thus, the memory chip 10 can acquire 2-bit data with less error from the memory cells MT concerned.

In the fine programming operation, the threshold voltages of the individual memory cells MT are maintained or slightly raised in accordance with new 1-bit data received from the memory controller 2 to be included in any of the eight sections R0 to R7.

Specifically, after the MLC programming operation the threshold voltage of the memory cell MT being in the state S0" is maintained in the state S0"(S0) or set in state S1 in accordance with newly input 1-bit data. The threshold voltage of the memory cell MT being in the state S1" is set in the state S2 or the state S3 in accordance with newly input 1-bit data. The threshold voltage of the memory cell MT being in the state S2" is set in the state S4 or the state S5 in accordance with newly input 1-bit data. The threshold voltage of the memory cell MT being in the state S3" is set in the state S6 or the state S7 in accordance with newly input 1-bit data.

FIG. 20 is a diagram illustrating an example of data coding according to the third embodiment. The data coding in FIG. 20 shows that the lower bit and the upper bit are written in the MLC programming operation while the upper bit is separately written in the fine programming operation. Herein, when data is denoted by "ab", "a" represents a lower bit value and "b" represents a middle bit value.

As illustrated in FIG. 20, data "11" is associated with the section R0" (state S0"). Data "10" is associated with the section R1" (state S1"). Data "00" is associated with the section R2" (state S2"). Data "01" is associated with the section R3" (state S3").

Further, data "111" is associated with the section R0 (state S0), data "110" is associated with the section R1 (state S1), data "100" is associated with the section R2 (state S1), data "101" is associated with the section R3 (state S3), data "001" is associated with the section R4 (state S4), data "000" is associated with the section R5 (state S5), data "010" is associated with the section R6 (state S6), and data "001" is associated with the section R7 (state S7).

According to this exemplary data coding, the lower page values and the middle page values are set to the same values irrespective of the upper bit values. Thus, after lower bits and middle bits are written by the MLC programming operation, three-page data can be written by adding an upper page in the fine programming operation.

In the third embodiment, the memory chip 10 writes the temperature information TEMP to different pages among the lower, middle, and upper pages by the MLC programming operation and by the fine programming operation.

Figure 21:
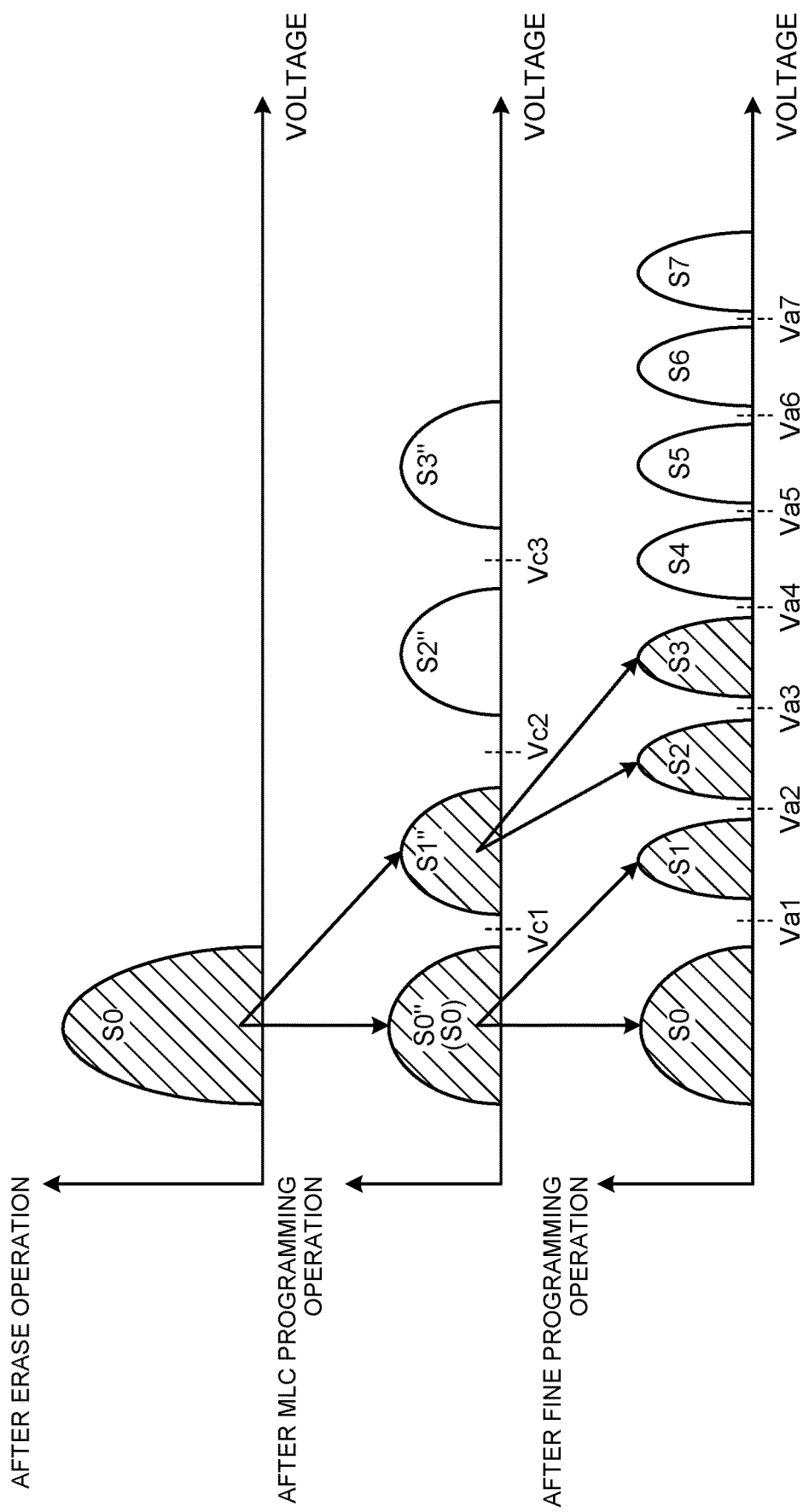
FIG. 21 is a schematic diagram illustrating an example of shift in the threshold voltage of the memory cells MT constituting a temperature storage region ARtemp according to the third embodiment.

FIG. 21 schematically illustrates an example of shift in the threshold voltages of the memory cells MT constituting a temperature storage region ARtemp in the third embodiment. In FIG. 21, distributions that may include the memory cells MT constituting the temperature storage region ARtemp are indicated by hatching. Referring to FIG. 21, the memory cells MT constituting the temperature storage region ARtemp are simply referred to as memory cells MT unless otherwise specified.

In the MLC programming operation the threshold voltages of the memory cells MT are set in the state S0" (S0) or state S1" in accordance with the temperature bit value TEMP-b.

In the subsequent fine programming operation, the threshold voltages of the memory cells MT are set to one of the states S0 to S3 in accordance with the temperature bit value TEMP-b. The threshold voltages of the memory cells MT, set in the state S0" by the MLC programming operation, is set in the state S0 or the state S1 by the fine programming operation in accordance with the temperature bit value TEMP-b. The threshold voltages of the memory cells MT, set in the state S1" by the MLC programming operation, is set in the state S2 or the state 33 by the fine programming operation in accordance with the temperature bit value TEMP-b.

FIG. 22 is a diagram illustrating data to be generated in a programming operation to the temperature storage region ARtemp in the third embodiment. Referring to FIG. 22, the memory cells MT constituting the temperature storage region ARtemp are simply referred to as memory cells MT unless otherwise specified.

In the MLC programming operation, in response to the temperature bit value TEMP-b of 0, the sequencer 16 generates data "11" and supplies the data "11" to the column module 18. Specifically, values "1" and "1" are written to the lower bit and the middle bit of the memory cell MT, respectively. In this manner, the threshold voltage of the memory cell MT is set in the state S0. In response to the temperature bit value TEMP-b of 1, the sequencer 16 generates data "10" and supplies the data "10" to the column module 18. Specifically, values "1" and "0" are written to the lower bit and the middle bit of the memory cell MT, respectively. In this manner, the threshold voltage of the memory cell MT is set in the state S1".

In the fine programming operation, in response to the temperature bit value TEMP-b of 0, the sequencer 16 generates data "0" for the upper bit. The control circuitry 15 then reads the 2-bit written data i.e., the lower and upper bit values, from the memory cell MT by internal data loading. Next, the sequencer 16 combines the read lower and upper bit values and the generated upper bit value to supply 3-bit data to the column module 18.

As an example, when the temperature bit value TEMP-b of 0 is written in the MLC programming operation, data "11" is read by internal data loading. The sequencer 16 combines the read data "11" and the upper bit "0" to supply data "110" to the column module 18. Specifically, values "1", "1", and "0" are written to the lower bit, the middle bit, and the upper bit of the memory cell MT, respectively. In this manner, the threshold voltage of the memory cell MT is set in the state S1.

When the temperature bit value TEMP-b of 1 is written in the MLC programming operation, data "10" is read by internal data loading. The sequencer 16 combines the read data "10" and the upper bit "0" to supply data "100" to the column module 18. Specifically, values "1", "0", and "0" are written to the lower bit, the middle bit, and the upper bit of the memory cell MT, respectively. In this manner, the threshold voltage of the memory cell MT is set in the state S2.

In the fine programming operation, in response to the temperature bit value TEMP-b of 1, the sequencer 16 generates data "1" for the upper bit. The control circuitry 15 then reads the 2-bit written data, i.e., the lower and upper bit values, from the memory cell MT by internal data loading.

The sequencer 16 combines the read lower and upper bit values and the generated upper bit value to supply 3-bit data to the column module 18.

For example, when the temperature bit value TEMP-b of 0 is written in the MLC programming operation, data "11" is read by internal data loading. The sequencer 16 combines the read data "11" and the upper bit "1" to supply data "111" to the column module 18. Specifically, values "1", "1", and "1" are written to the lower bit, the middle bit, and the upper bit of the memory cell MT, respectively. In this manner, the threshold voltage of the memory cell MT is set in the state S0.

When the temperature bit value TEMP-b of 1 is written in the MLC programming operation, data "10" is read by internal data loading. The sequencer 16 combines the read data "10" and the upper bit "1" to supply data "101" to the column module 18. Specifically, values "1", "0", and "1" are written to the lower bit, the middle bit, and the upper bit of the memory cell MT, respectively. In this manner, the threshold voltage of the memory cell MT is set in the state S4.

Thus, according to the example illustrated in FIG. 22, the temperature information TEMP related to the MLC programming operation, namely, numerical information obtained by bit-inverting the temperature information TEMP, is written to the middle page, and the temperature information TEMP related to the fine programming operation is written to the upper page.

In this manner, the memory controller 2 can acquire the temperature information TEMP related to the fine programming operation by instructing the memory chip 10 to perform a read operation to the upper page. Also, the memory controller 2 can acquire the temperature information TEMP related to the MLC programming operation by instructing the memory chip 10 to perform a read operation to the middle page.

The page to which the temperature information TEMP is written in the MLC programming operation may not be the middle page. The memory chip 10 may be configured to write the temperature information TEMP to the lower page in the MLC programming operation.

Figure 23:
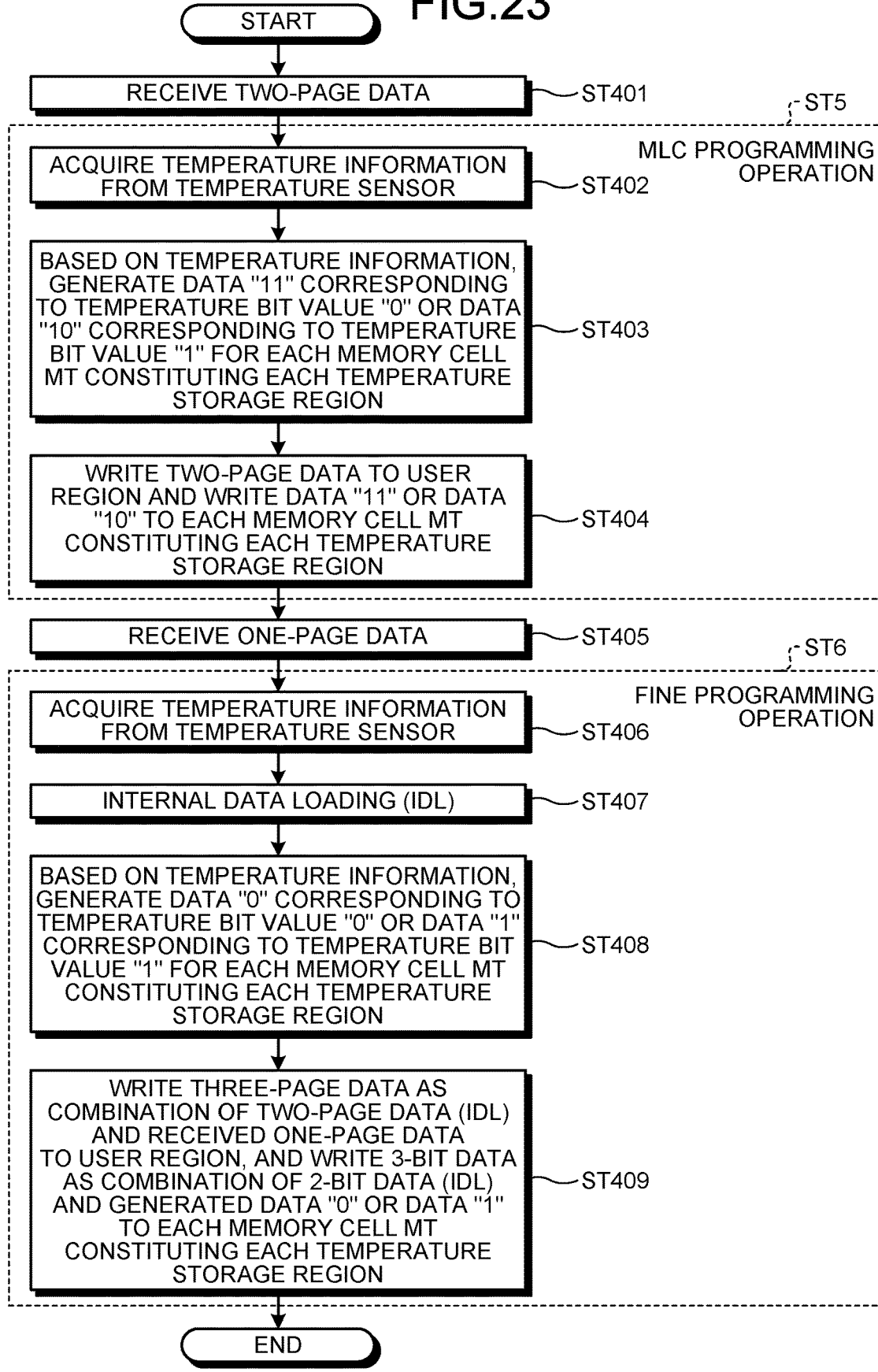
FIG. 23 is a flowchart illustrating an exemplary programming operation of a memory chip according to the third embodiment.

FIG. 23 is a flowchart illustrating an exemplary programming operation of the memory chip 10 in the third embodiment.

The I/O interface 13 receives two-page data, i.e., lower-page data and middle-page data, together with a write command from the memory controller 2 (ST401). The control circuitry 15 then executes an MLC programming operation (ST5).

In the MLC programming operation the sequencer 16 acquires temperature information TEMP from the temperature sensor 12 (ST402). Based on the temperature information TEMP acquired in ST402, the sequencer 16 generates data "11" corresponding to the temperature bit value TEMP-b of 0 or data "10" corresponding to the temperature bit value TEMP-b of 1 for each of the memory cells MT constituting each temperature storage region ARtemp (ST403).

The control circuitry 15 applies a programming pulse to the word line WL connected to the memory cell group MCG as a write destination once or more so as to write the two-page data received in ST401 to the user region ARusr. Specifically, the control circuitry 15 writes the data "11" or the data "10" generated in ST403 to the individual memory cells MT constituting each temperature storage region ARtemp (ST404). Thus, the control circuitry 15 writes 2-bit data per memory cell MT to the user region ARusr and the temperature storage region ARtemp. This ends the MLC programming operation.

Subsequently, the I/O interface 13 receives one-page data, i.e., upper page data, from the memory controller 2 (ST405). The control circuitry 15 then executes a fine programming operation (ST6).

In the fine programming operation the sequencer 16 acquires temperature information TEMP from the temperature sensor 12 (ST406). By internal data loading, the control circuitry 15 acquires the two-page data written in ST404 from the user region ARusr, and acquires the data "11" or data "10" written in ST404 from the temperature storage region ARtemp (ST407). Specifically, the control circuitry 15 acquires 2-bit data per memory cell MT from the user region ARusr and the temperature storage region ARtemp.

Based on the temperature information TEMP acquired in ST406, the sequencer 16 generates data "0" corresponding to the temperature bit value TEMP-b of 0 or data "1" corresponding to the temperature bit value TEMP-b of 1 for each of the memory cells MT constituting each temperature storage region ARtemp (ST408).

The control circuitry 15 writes three-page data, which is a combination of the two-page data read in ST407 and the one-page data received in ST405, to the user region ARusr by applying a programming pulse to the word line WL connected to the memory cell group MCG as a write destination once or more (ST409). Further, the control circuitry 15 writes 3-bit data, which is a combination of 2-bit data per memory cell MT read in ST407 and the data "0" or "1" generated in ST408, to each of the memory cells MT constituting each temperature storage region ARtemp (ST409). This completes the fine programming operation and the programming operation in the third embodiment.

By instructing the memory chip 10 to perform a read operation to the middle page, the memory controller 2 can acquire the temperature information TEMP written during the MLC programming operation. In addition, by instructing the memory chip 10 to perform a read operation to the upper page, the memory controller 2 can acquire the temperature information TEMP written during the fine programming operation.

In the above example, P is defined to be 2 and Q is defined to be 1. The values of P and Q are not limited to these values.

According to the third embodiment, the I/O interface 13 receives P-bit data, i.e., P-page data, per memory cell MT. After P-page data, the I/O interface 13 receives Q-bit data, i.e., Q-page data, per memory cell MT. In response to the I/O interface 13's receiving P-page data, the control circuitry 15 executes the first-stage programming operation.

In the first-stage programming operation the control circuitry 15 acquires temperature information from the temperature sensor 12. Subsequently, the control circuitry 15 sets the threshold voltage of each of the memory cells MT constituting the user region ARusr in a section corresponding to P-page data among the $2^P$ sections. Furthermore, the control circuitry 15 sets the threshold voltage of each of the memory cells MT constituting the temperature storage region ARtemp in a section corresponding to the temperature information TEMP acquired by the first-stage programming operation among the $2^P$ sections.

In response to the I/O interface 13's receiving Q-page data after the first-stage programming operation, the control circuitry 15 executes the second-stage programming operation.

In the second-stage programming operation the control circuitry 15 acquires temperature information TEMP from the temperature sensor 12. The control circuitry 15 then acquires P-page data from the user region ARusr by internal data loading. The control circuitry 15 acquires, from the temperature storage region ARtemp, 2-bit data per memory cell MT corresponding to the temperature information TEMP acquired by the first-stage programming operation. The control circuitry 15 sets the threshold voltage of each of the memory cells MT constituting the user region ARusr in a section corresponding to (P+Q) page data among the $2^{(P+Q)}$ sections. The (P+Q) page data is a combination of the P-page data acquired by internal data loading and the Q-page data received by the I/O interface 13. Specifically, the control circuitry 15 writes (P+Q)-page data to the user region ARusr. Furthermore, the control circuitry 15 sets the threshold voltage of each of the memory cells MT constituting the temperature storage region ARtemp in a second section of the $2^{(P+Q)}$ sections. The second section corresponds to the combination of the temperature information TEMP acquired by internal data loading and the temperature information TEMP acquired from the temperature sensor 12 by the second-stage programming operation.

Such an operation makes it possible for the memory controller 2 to acquire both the temperature information TEMP related to the first-stage programming operation and the temperature information TEMP related to the second-stage programming operation from the memory cell group MCG in which the second-stage programming operation has been completed.

Fourth Embodiment

The second embodiment has described the foggy-fine programming operation that the temperature information TEMP is written in both of the foggy programming operation and the fine programming operation. However, the temperature information TEMP written in the foggy programming operation is no longer available after the fine programming operation.

In view of this, in a fourth embodiment the temperature information TEMP is written to different memory cells MT in the memory cell group MCG in the foggy programming operation and in the fine programming operation. This makes it possible to acquire the temperature information TEMP related to the foggy programming operation after completion of the fine programming operation.

Figure 24:
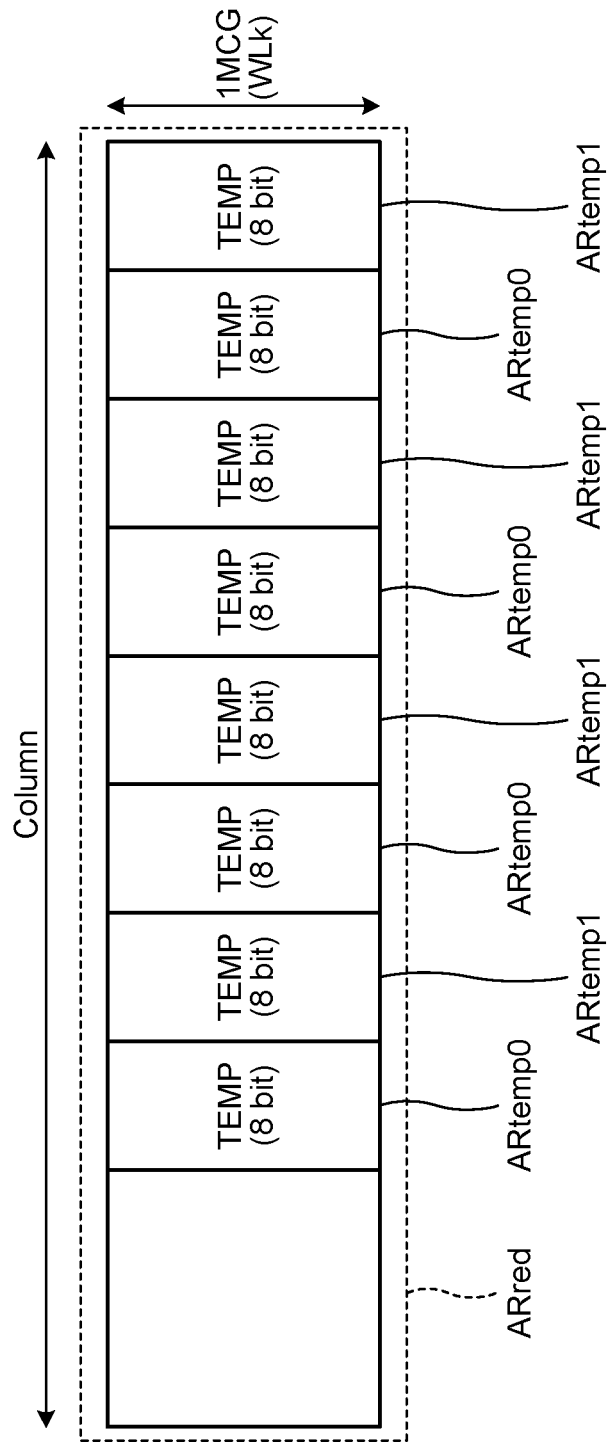
FIG. 24 is a schematic diagram illustrating an exemplary write location of the temperature information TEMP in a redundant region ARred provided in a memory cell group MCG according to a fourth embodiment.

FIG. 24 is a schematic diagram illustrating an exemplary write location of the temperature information TEMP in a redundant region ARred provided in the memory cell group MCG in the fourth embodiment.

As illustrated in FIG. 24, the redundant region ARred includes pairs of temperature storage regions ARtemp0 and ARtemp1. The temperature information TEMP is written to the temperature storage regions ARtemp0 in the foggy programming operation. The temperature information TEMP is written to the temperature storage regions ARtemp1 in the fine programming operation. As an example, four pairs of temperature storage regions ARtemp0 and ARtemp1 are provided herein. Specifically, the memory cell group MCG includes 32 memory cells MT to which four pieces of temperature information TEMP are written in the foggy programming operation and 32 memory cells MT to which four pieces of temperature information TEMP are written in the fine programming operation.

Figure 25:
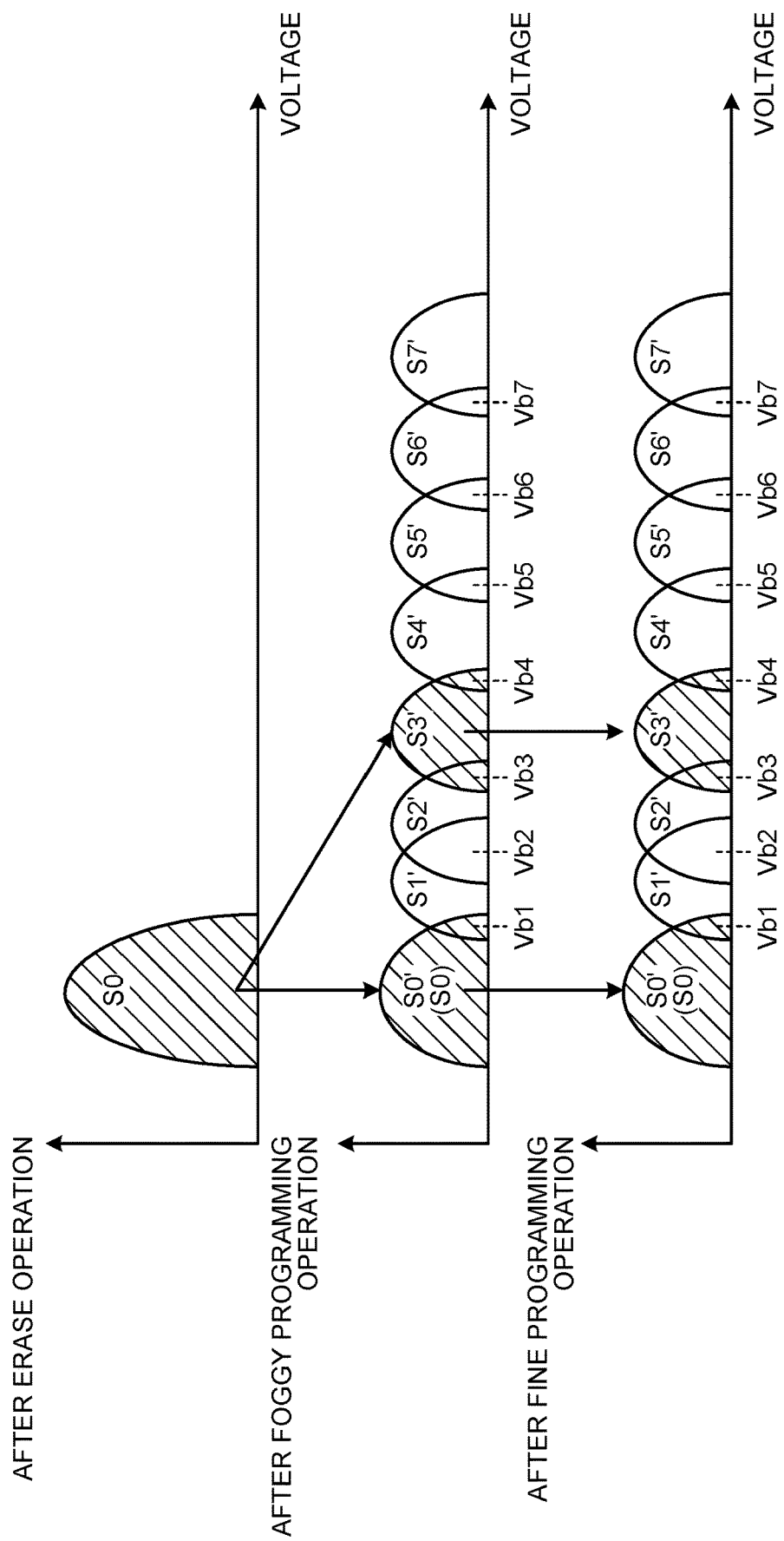
FIG. 25 is a schematic diagram illustrating an example of shift in the threshold voltage of the memory cells MT constituting a temperature storage region ARtemp0 according to the fourth embodiment.

FIG. 25 is a schematic diagram illustrating an example of shift in the threshold voltages of the memory cells MT constituting the temperature storage region ARtemp0 in the fourth embodiment. In FIG. 25, distributions that may include the memory cells MT constituting the temperature storage region ARtemp0 are indicated by hatching. Referring to FIG. 25, the memory cells MT constituting the temperature storage region ARtemp0 are simply referred to as memory cells MT unless otherwise specified.

In the foggy programming operation the threshold voltages of the memory cells MT are set in the state S0' (S0) or the state S3' in accordance with the temperature bit value TEMP-b.

In the fine programming operation the threshold voltages of the memory cells MT are maintained in states after the foggy programming operation.

Figure 26:
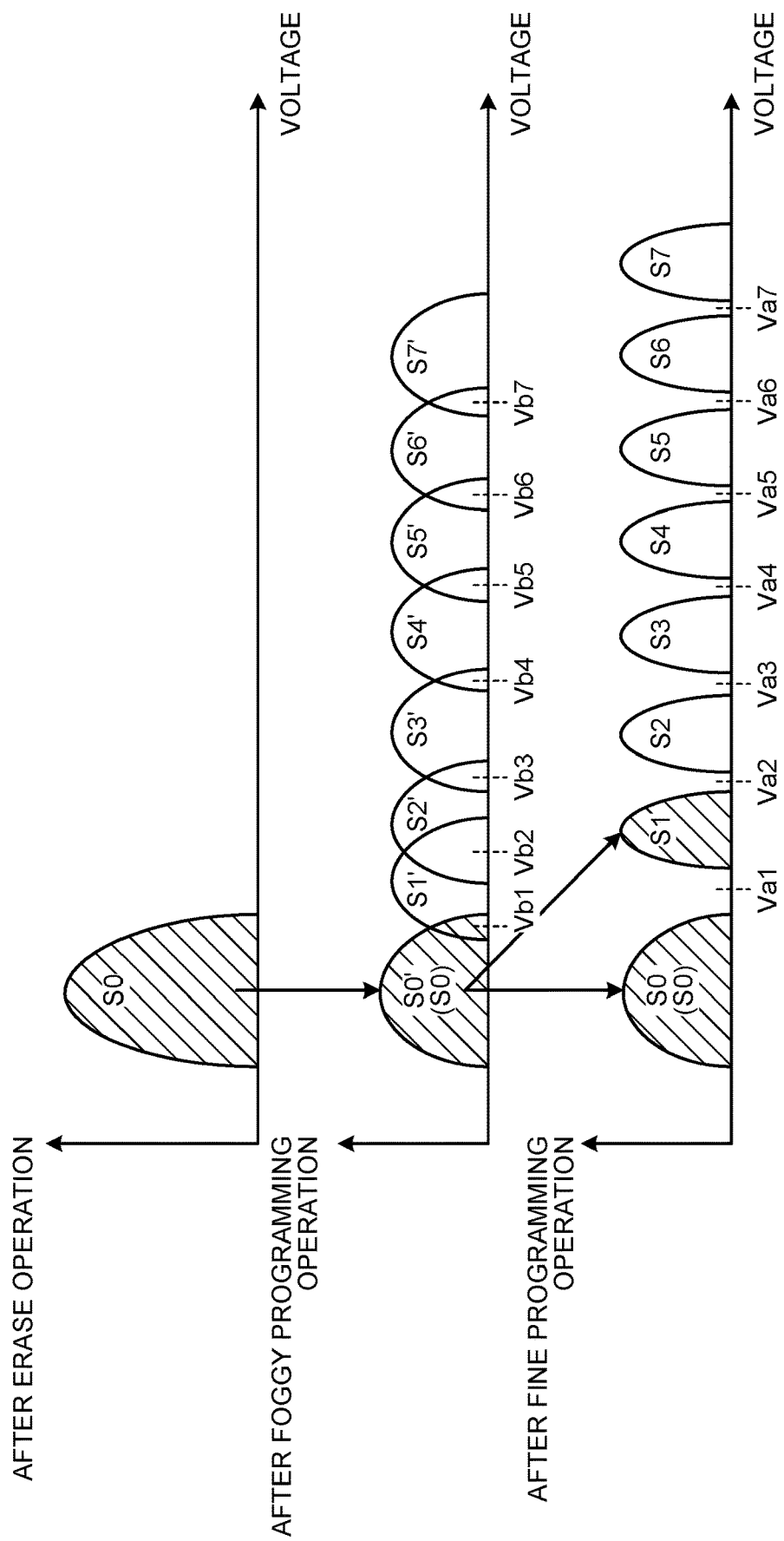
FIG. 26 is a schematic diagram illustrating an example of shift in the threshold voltage of the memory cells MT constituting a temperature storage region ARtemp1 according to the fourth embodiment.

FIG. 26 is a schematic diagram illustrating an example of shift in the threshold voltages of the memory cells MT constituting the temperature storage region ARtemp1 in the fourth embodiment. In FIG. 26, the distributions that may include the memory cells MT constituting the temperature storage region ARtemp1 are indicated by hatching. Referring to FIG. 26, the memory cells MT constituting the temperature storage region ARtemp1 are simply referred to as memory cells MT unless otherwise specified.

As in the first embodiment, the threshold voltages of the memory cells MT are set in the state S0' (S0) in the foggy programming operation regardless of the temperature bit value TEMP-b.

As in the first embodiment, the threshold voltages of the memory cells MT are set in the state S0 or the state S1 in the fine programming operation in accordance with the temperature bit value TEMP-b.

FIG. 27 is a diagram illustrating 3-bit data to be generated in a programming operation to the temperature storage regions ARtemp0 and ARtemp1 in the fourth embodiment.

In the foggy programming operation, the sequencer 16 generates data "000" for the temperature storage region ARtemp0 in response to the temperature bit value TEMP-b of 0, and supplies the data "000" to the column module 18. Specifically, values "0", "0", and "0" are written to the lower bit, the middle bit, and the upper bit of the memory cell MT, respectively. In this manner, the threshold voltage of the memory cell MT is set in the state S3'. In response to the temperature bit value TEMP-b of 1, the sequencer 16 generates data "111" and supplies the data "111" to the column module 18. Specifically, values "1", "1", and "1" are written to the lower bit, the middle bit, and the upper bit of the memory cell MT, respectively. In this manner, the threshold voltage of the memory cell MT is set in the state S0' (S0).

In the fine programming operation, the sequencer 16 generates data "111" for the temperature storage region ARtemp0 regardless of whether the temperature bit value TEMP-b is 0 or 1, and supplies the data "111" to the column module 18. Thus, values "1", "1", and "1" are written to the lower bit, the middle bit, and the upper bit of the memory cell MT, respectively.

The data "111" corresponds to the lowest-voltage state S0 among the states S0 to S7. After the foggy programming operation, however, the threshold voltage of the memory cell MT is in the state S0' equal to the state S0 or in the state S3' located on the higher voltage side than the state S0. Thus, in the fine programming operation the threshold voltage is not raised from the state S0' (S0) or the state S3' but maintained.

The sequencer 16 generates data "111" for the temperature storage region ARtemp1 in the foggy programming operation regardless of whether the temperature bit value TEMP-b is 0 or 1, and supplies the data "111" to the column module 18. Specifically, values "1", "1", and "1" are written to the lower bit, the middle bit, and the upper bit of the memory cell MT, respectively. In this manner, the threshold voltage of the memory cell MT is set in the state S0' (S0).

In the fine programming operation, in response to the temperature bit value TEMP-b of 0, the sequencer 16 generates data "011" for the temperature storage region ARtemp1 and supplies the data "011" to the column module 18. Specifically, values "0", "1", and "1" are written to the lower bit, the middle bit, and the upper bit of the memory cell MT, respectively. Thus, the threshold voltage of the memory cell MT is set in the state S1 corresponding to the temperature bit value TEMP-b of 0. In response to the temperature bit value TEMP-b of 1, the sequencer 16 generates data "111" and supplies the data "111" to the column module 18. Specifically, values "1", "1", and "1" are written to the lower bit, the middle bit, and the upper bit of the memory cell MT, respectively. Thus, the threshold voltage of the memory cell MT is set in the state S0 corresponding to the temperature bit value TEMP-b of 1.

According to the fourth embodiment, the control circuitry 15 acquires the temperature information TEMP from the temperature sensor 12 in the foggy programming operation being the first-stage programming operation. The control circuitry 15 then sets the threshold voltage of each of the memory cells MT constituting the user region ARusr in a state corresponding to write data, namely, one of the states S0' to S7'. Further, the control circuitry 15 sets the threshold voltages of the memory cells MT constituting the temperature storage region ARtemp0 in one of the two states S0' and S3' corresponding to the temperature information TEMP acquired in the foggy programming operation.

In addition, the control circuitry 15 acquires the temperature information TEMP from the temperature sensor 12 in the fine programming operation being the second-stage programming operation. The control circuitry 15 then sets the threshold voltage of each of the memory cells MT constituting the user region ARusr in a state corresponding to write data, namely, one of the states S0 to S7. Further, the control circuitry 15 sets the threshold voltages of the memory cells MT constituting the temperature storage region ARtemp1 in a state corresponding to the temperature information TEMP acquired in the fine programming operation, namely, one of the two states S0 and S1.

In this manner, the memory controller 2 can acquire the temperature information TEMP related to the foggy programming operation by instructing the memory chip 10 to perform a read operation to the temperature storage regions ARtemp0. The memory controller 2 can also acquire the temperature information TEMP written in the fine programming operation by instructing the memory chip 10 to perform a read operation to the temperature storage regions ARtemp1.

The two states of the threshold voltages of the memory cells MT to be set in accordance with the temperature bit value TEMP-b in the foggy programming operation and the fine programming operation are not limited to the above examples.

For example, for the memory cells MT constituting the temperature storage region ARtemp1, the control circuitry 15 may set the threshold voltages in a state located second or subsequent from the low voltage side among the states S0' to S7' in the foggy programming operation, as in the second modification of the first embodiment.

In the fine programming operation, the control circuitry 15 may set the threshold voltages of the memory cells MT constituting the temperature storage region ARtemp1 to one of two states apart from each other across one or more states. As in the first modification of the first embodiment, the control circuitry 15 may set the threshold voltages of the memory cells MT constituting the temperature storage region ARtemp1 in one of two states apart from each other across two states.

The designer can freely determine two states of the threshold voltages of the memory cells MT to be set in the fine programming operation, as long as after the fine programming operation the memory cells MT constituting the temperature storage region ARtemp1 are in a state the same as or on the higher voltage side than the state after the foggy programming operation.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
   a first set of memory cells each of which has a gate connected to a word line, and each of which is configured to store data in a non-volatile manner corresponding to a threshold voltage thereof, the first set of memory cells including a second set of memory cells and a third set of memory cells different from the second set of memory cells;
   a temperature sensor;
   an interface configured to receive write data; and
   control circuitry configured to execute a first programming operation and execute a second programming operation after the first programming operation,
   the first programming operation including
      by applying a programming voltage to the word line,
      setting the threshold voltage of each of the second set of memory cells in a second section corresponding to the write data among a plurality of first sections, and
      setting the threshold voltage of each of the third set of memory cells in a third section among the plurality of first sections, and
   the second programming operation including
      by applying a programming voltage to the word line,
      setting the threshold voltage of each of the second set of memory cells in a fifth section corresponding to the write data among a plurality of fourth sections, a total voltage range of the plurality of fourth sections being wider in voltage range than a total voltage range of the plurality of first sections, and
      setting the threshold voltage of each of the third set of memory cells in a sixth section or a seventh section among the plurality of fourth sections in accordance with first temperature information detected by the temperature sensor, the sixth section including the same voltage range as the third section, the seventh section being higher in voltage range than the third section.

2. The memory device according to claim 1, wherein the control circuitry is further configured to acquire the first temperature information from the temperature sensor in the second programming operation.

3. The memory device according to claim 1, wherein the control circuitry is further configured to:

acquire, in the first programming operation, second temperature information from the temperature sensor to select a third section from the plurality of first sections, corresponding to the second temperature information, and acquire the first temperature information from the temperature sensor in the second programming operation.

4. The memory device according to claim 1, wherein the third section is second or higher from a section having the lowest voltage.

5. The memory device according to claim 2, wherein the third section is second or higher from a section having the lowest voltage.

6. The memory device according to claim 3, wherein the third section is second or higher from a section having the lower voltage.

7. The memory device according to claim 1, wherein the sixth section and the seventh section are apart from each other by two or more of the plurality of fourth sections.

8. The memory device according to claim 2, wherein the sixth section and the seventh section are apart from each other by two or more of the plurality of fourth sections.

9. The memory device according to claim 3, wherein the sixth section and the seventh section are apart from each other by two or more of the plurality of fourth sections.

10. The memory device according to claim 4, wherein the sixth section and the seventh section are apart from each other by two or more of the plurality of fourth sections.

11. The memory device according to claim 5, wherein the sixth section and the seventh section are apart from each other by two or more of the plurality of fourth sections.

12. The memory device according to claim 6, wherein the sixth section and the seventh section are apart from each other by two or more of the plurality of fourth sections.

13. A memory device comprising:
a first set of memory cells each of which has a gate connected to a word line; and each of which is configured to store data in a non-volatile manner corresponding to a threshold voltage thereof, the first set of memory cells including a second set of memory cells and a third set of memory cells different from the second set of memory cells;
a temperature sensor;
an interface configured to:
  receive first write data of P bits per memory cell where P is an integer of one or more, and
  receive, after the first write data, second write data of Q bits per memory cell where Q is an integer of one or more; and
control circuitry configured to execute a first programming operation in response to a receipt of the first write data by the interface and execute a second programming operation in response to a receipt of the second write data by the interface,
the first programming operation including
  acquiring first temperature information from the temperature sensor, and
  by applying a programming voltage to the word line,
    setting the threshold voltage of each of the second set of memory cells in a second section corresponding to the first write data among $2^P$ first sections, and
    setting threshold voltage of each of the third set of memory cells in a third section corresponding to the first temperature information, among the $2^P$ first sections, and
the second programming operation including
  acquiring second temperature information from the temperature sensor,
  reading the first write data and the first temperature information from the first set of memory cells, and
  by applying a programming voltage to the word line,
    setting the threshold voltage of each of the second set of memory cells in a fifth section among $2^{(P+Q)}$ fourth sections, the second section corresponding to a combination of the first write data and the second write data, and
    setting the threshold voltage of each of the third set of memory cells in a sixth section among the $2^{(P+Q)}$ fourth sections, the second section corresponding to a combination of the first temperature information and the second temperature information.

14. A memory device comprising:
a first set of memory cells each of which has a gate connected to a word line and each of which is configured to store data in a non-volatile manner corresponding to a threshold voltage thereof, the first set of memory cells including a second set of memory cells, a third set of memory cells different from the second set of memory cells, and a fourth set memory cells different from the second set of memory cells and the third set of memory cells;
a temperature sensor;
an interface configured to receive write data; and
control circuitry configured to execute a first programing operation and execute a second programming operation after the first programming operation,
the first programming operation including
  acquiring first temperature information from the temperature sensor, and
  by applying a programming voltage to the word line,
    setting the threshold voltage of each of the second set of memory cells in a second section corresponding to the write data among a plurality of first sections,
    setting the threshold voltage of each of the third set of memory cells in a third section among the plurality of first sections, the third section corresponding to the first temperature information, and
    setting the threshold voltage of each of the fourth set of memory cells in a fourth section among the plurality of first sections, the fourth section corresponding to the first temperature information, and
the second programming operation including
  acquiring second temperature information from the temperature sensor,
  by applying a programming voltage to the word line,
    setting the threshold voltage of each of the second set of memory cells in a sixth section corresponding to the write data among a plurality of fifth sections, a total voltage range of the plurality of fifth sections being wider in voltage range than a total voltage range of the plurality of first sections, and
    setting the threshold voltage of each of the fourth set of memory cells in a seventh section or an eighth section in accordance with the second temperature information among the plurality of fifth sections, the seventh section including the same voltage range as the fourth section, the eighth section being higher in voltage range than the fourth section.

15. The memory device according to claim 14, wherein the fourth section is second or higher from a section having the lowest voltage.

16. The memory device according to claim 14, wherein the seventh section and the eighth section are apart from each other by two or more of the plurality of fifth sections.

17. The memory device according to claim 15, wherein the seventh section and the eighth section are apart from each other by two or more of the plurality of fifth sections.

* * * * *